US009869013B2

(12) United States Patent
Sun et al.

(10) Patent No.: US 9,869,013 B2
(45) Date of Patent: *Jan. 16, 2018

(54) ION ASSISTED DEPOSITION TOP COAT OF RARE-EARTH OXIDE

(71) Applicant: Applied Materials, Inc., Santa Clara, CA (US)

(72) Inventors: Jennifer Y. Sun, Mountain View, CA (US); Biraja P. Kanungo, San Jose, CA (US); Vahid Firouzdor, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/262,644

(22) Filed: Apr. 25, 2014

(65) Prior Publication Data

US 2015/0311044 A1    Oct. 29, 2015

(51) Int. Cl.
*C23C 14/08* (2006.01)
*C23C 14/22* (2006.01)
(Continued)

(52) U.S. Cl.
CPC ............ *C23C 14/221* (2013.01); *C23C 4/134* (2016.01); *C23C 14/08* (2013.01); *C23C 14/081* (2013.01);
(Continued)

(58) Field of Classification Search
CPC ......... C23C 4/105; C23C 4/127; C23C 4/128; C23C 14/0052; C23C 14/0084;
(Continued)

(56) References Cited

U.S. PATENT DOCUMENTS 3,796,182 A    3/1974  Rosler
4,399,199 A    8/1983  McGill
(Continued)

FOREIGN PATENT DOCUMENTS

JP    2007-138288 A    6/2007
JP    2007-191794 A    8/2007
(Continued)

OTHER PUBLICATIONS

Machine translation of KR10-1108692 B1 by Park et al., issued Jan. 25, 2012.*

(Continued)

*Primary Examiner* — Marianne L Padgett
(74) *Attorney, Agent, or Firm* — Lowenstein Sandler LLP

(57) ABSTRACT

A method of manufacturing an article comprises providing an article such as a chamber component for an etch reactor. A plasma spray deposition process is performed for deposit a first protective layer over at least one surface of the chamber component. The first protective layer is a plasma resistant ceramic having a thickness of greater than approximately 50 microns and a plurality of cracks and pores. An ion assisted deposition (IAD) process is then performed to deposit a second protective layer over the first protective layer. The second protective layer is a plasma resistant rare earth oxide having a thickness of less than 50 microns and a porosity of less than 1%. The second protective layer seals the plurality of cracks and pores of the first protective layer.

5 Claims, 10 Drawing Sheets

(51) Int. Cl.
*H01J 37/32* (2006.01)
*C23C 4/134* (2016.01)
*C23C 14/46* (2006.01)

(52) U.S. Cl.
CPC .......... *C23C 14/46* (2013.01); *H01J 37/32477* (2013.01); *H01J 37/32495* (2013.01); *H01J 37/32807* (2013.01)

(58) Field of Classification Search
CPC ..... C23C 14/08; C23C 14/081; C23C 14/088; C23C 14/221; C23C 14/28; C23C 14/46; C23C 14/48; Y10T 428/49981; H01J 37/32477; H01J 37/32495
USPC ....... 427/453, 454, 529, 533, 539, 576, 564; 204/192.16, 192.22–192.24, 192.27
See application file for complete search history.

(56) References Cited

U.S. PATENT DOCUMENTS

| | | |
|---|---|---|
| 4,695,439 A | 9/1987 | Ritsko et al. |
| 4,773,928 A | 9/1988 | Houck et al. |
| 4,880,614 A | 11/1989 | Strangman et al. |
| 4,988,670 A | 1/1991 | Itozaki et al. |
| 5,415,756 A | 5/1995 | Wolfe et al. |
| 5,573,862 A | 11/1996 | Gualtieri et al. |
| 5,741,544 A | 4/1998 | Mahulikar |
| 5,837,058 A | 11/1998 | Chen et al. |
| 6,326,076 B1 | 12/2001 | Takai |
| 6,530,990 B2 | 3/2003 | Kong et al. |
| 6,884,514 B2 | 4/2005 | Simpson et al. |
| 6,949,203 B2 | 9/2005 | Hsieh et al. |
| 6,962,524 B2 | 11/2005 | Butterfield et al. |
| 7,278,911 B2 | 10/2007 | Butterfield et al. |
| 7,351,482 B2 | 4/2008 | Boutwell et al. |
| 7,354,663 B2 | 4/2008 | Torigoe et al. |
| 7,422,516 B2 | 9/2008 | Butterfield et al. |
| 7,479,464 B2 | 1/2009 | Sun et al. |
| 7,672,110 B2 | 3/2010 | Sun et al. |
| 7,696,117 B2 | 4/2010 | Sun et al. |
| 7,838,083 B1 | 11/2010 | Youchison et al. |
| 8,034,734 B2 | 10/2011 | Sun et al. |
| 8,110,043 B2 | 2/2012 | Hass et al. |
| 8,129,029 B2 | 3/2012 | Sun et al. |
| 8,206,829 B2 | 6/2012 | Sun et al. |
| 8,367,227 B2 | 2/2013 | Sun et al. |
| 8,758,858 B2 | 6/2014 | Sun et al. |
| 8,858,745 B2* | 10/2014 | Sun .......................... C03C 3/247 106/14.05 |
| 8,941,969 B2* | 1/2015 | Thach ............... H01L 21/67103 361/230 |
| 9,034,199 B2 | 5/2015 | Duan et al. |
| 9,090,046 B2 | 7/2015 | Sun et al. |
| 9,212,099 B2 | 12/2015 | Sun et al. |
| 9,460,898 B2* | 10/2016 | Kim .................. H01J 37/32357 |
| 9,583,369 B2* | 2/2017 | Sun ........................ B65D 43/02 |
| 9,711,334 B2* | 7/2017 | Sun .................. H01J 37/32642 |
| 9,725,799 B2* | 8/2017 | Sun ...................... C04B 41/5045 |
| 2002/0018902 A1 | 2/2002 | Tsukatani et al. |
| 2002/0018921 A1 | 2/2002 | Yamada et al. |
| 2002/0043666 A1* | 4/2002 | Parsons .................. B82Y 10/00 257/200 |
| 2002/0100424 A1 | 8/2002 | Sun et al. |
| 2003/0024807 A1* | 2/2003 | Baldwin ................. C23C 14/46 204/192.12 |
| 2003/0029563 A1* | 2/2003 | Kaushal ............. C23C 16/4404 156/345.1 |
| 2003/0047464 A1 | 3/2003 | Sun et al. |
| 2003/0049500 A1 | 3/2003 | Takai et al. |
| 2003/0051811 A1 | 3/2003 | Uchimaru et al. |
| 2003/0134134 A1 | 7/2003 | Simpson et al. |
| 2003/0164354 A1 | 9/2003 | Hsieh et al. |
| 2003/0175142 A1* | 9/2003 | Milonopoulou .... C23C 14/3414 419/49 |
| 2003/0203120 A1 | 10/2003 | Tsukatani et al. |
| 2004/0023811 A1 | 2/2004 | Iijima |
| 2004/0157473 A1* | 8/2004 | Hayashi ............ H01L 21/28202 438/785 |
| 2004/0168636 A1 | 9/2004 | Savvides et al. |
| 2004/0191545 A1* | 9/2004 | Han .................... C23C 16/4404 428/472 |
| 2005/0037193 A1 | 2/2005 | Sun et al. |
| 2005/0164513 A1 | 7/2005 | DeOrnellas et al. |
| 2005/0181566 A1* | 8/2005 | Machida ............ H01L 29/66757 438/301 |
| 2005/0227118 A1 | 10/2005 | Uchimaru et al. |
| 2005/0284770 A1 | 12/2005 | Butterfield et al. |
| 2006/0051602 A1* | 3/2006 | Iacovangelo ......... C04B 41/009 428/472 |
| 2006/0081939 A1* | 4/2006 | Akasaka ............ H01L 21/28088 257/371 |
| 2006/0090704 A1* | 5/2006 | Ide .................... H01J 37/32192 118/723 MW |
| 2006/0096704 A1 | 5/2006 | Kim |
| 2006/0110609 A1 | 5/2006 | Eaton et al. |
| 2006/0141139 A1 | 6/2006 | Iorio et al. |
| 2007/0047170 A1 | 3/2007 | Sun et al. |
| 2007/0111030 A1 | 5/2007 | Nakano et al. |
| 2008/0009417 A1* | 1/2008 | Lou .................... H01L 21/68757 505/100 |
| 2008/0029032 A1 | 2/2008 | Sun et al. |
| 2008/0057326 A1 | 3/2008 | Schlichting et al. |
| 2008/0108225 A1 | 5/2008 | Sun et al. |
| 2008/0142755 A1* | 6/2008 | Vaidhyanathan ......... C03C 8/02 252/71 |
| 2008/0213496 A1 | 9/2008 | Sun et al. |
| 2008/0220177 A1 | 9/2008 | Hass et al. |
| 2008/0237029 A1* | 10/2008 | Tang .................... C23C 14/0036 204/164 |
| 2008/0261800 A1* | 10/2008 | Yuan ...................... C03B 32/00 501/152 |
| 2008/0264564 A1 | 10/2008 | Sun et al. |
| 2008/0264565 A1 | 10/2008 | Sun et al. |
| 2008/0268171 A1 | 10/2008 | Ma et al. |
| 2009/0036292 A1 | 2/2009 | Sun et al. |
| 2009/0075807 A1* | 3/2009 | Rosenflanz ............. C03B 19/01 501/77 |
| 2009/0142588 A1 | 6/2009 | Ohmi et al. |
| 2009/0162647 A1 | 6/2009 | Sun et al. |
| 2009/0214825 A1 | 8/2009 | Sun et al. |
| 2010/0028572 A1* | 2/2010 | Kobayashi ............... C03C 15/00 428/34.1 |
| 2010/0119843 A1 | 5/2010 | Sun et al. |
| 2010/0119844 A1* | 5/2010 | Sun .......................... C03C 3/247 428/426 |
| 2010/0129670 A1 | 5/2010 | Sun et al. |
| 2010/0160143 A1 | 6/2010 | Sun et al. |
| 2011/0086178 A1 | 4/2011 | Ruud et al. |
| 2011/0129684 A1 | 6/2011 | Okamoto et al. |
| 2011/0135915 A1 | 6/2011 | Lee et al. |
| 2011/0198034 A1 | 8/2011 | Sun et al. |
| 2011/0315081 A1 | 12/2011 | Law et al. |
| 2012/0034469 A1 | 2/2012 | Sun et al. |
| 2012/0068162 A1 | 3/2012 | Mandlik et al. |
| 2012/0074514 A1 | 3/2012 | Nguyen et al. |
| 2012/0104703 A1 | 5/2012 | Sun et al. |
| 2012/0125488 A1 | 5/2012 | Sun et al. |
| 2012/0144640 A1 | 6/2012 | Shih et al. |
| 2012/0154916 A1 | 6/2012 | Nishimoto et al. |
| 2012/0183790 A1 | 7/2012 | Petorak et al. |
| 2012/0196139 A1 | 8/2012 | Petorak et al. |
| 2013/0048606 A1 | 2/2013 | Mao et al. |
| 2013/0071685 A1 | 3/2013 | Iwaki et al. |
| 2013/0095256 A1 | 4/2013 | Hass et al. |
| 2013/0130052 A1 | 5/2013 | Menuey et al. |
| 2013/0156958 A1 | 6/2013 | Belov et al. |
| 2013/0174983 A1 | 7/2013 | Kikuchi et al. |
| 2013/0216783 A1 | 8/2013 | Duan et al. |
| 2013/0216821 A1 | 8/2013 | Sun et al. |
| 2013/0224498 A1 | 8/2013 | Sun et al. |
| 2013/0273313 A1 | 10/2013 | Sun et al. |
| 2013/0273327 A1 | 10/2013 | Sun et al. |

(56) References Cited

U.S. PATENT DOCUMENTS

| | | | |
|---|---|---|---|
| 2013/0284373 A1 | 10/2013 | Sun et al. | |
| 2013/0288037 A1 | 10/2013 | Sun et al. | |
| 2013/0333592 A1 | 12/2013 | Nakagawa et al. | |
| 2013/0334511 A1 | 12/2013 | Savas et al. | |
| 2014/0030486 A1 | 1/2014 | Sun et al. | |
| 2014/0030533 A1 | 1/2014 | Sun et al. | |
| 2014/0031533 A1 | 1/2014 | Liu et al. | |
| 2014/0037969 A1 | 2/2014 | Margolies et al. | |
| 2014/0079946 A1 | 3/2014 | Jindo et al. | |
| 2014/0154465 A1* | 6/2014 | Sun | H01L 21/6831 428/137 |
| 2014/0159325 A1 | 6/2014 | Parkhe et al. | |
| 2014/0177123 A1* | 6/2014 | Thach | H01L 21/67103 361/234 |
| 2014/0349073 A1 | 11/2014 | Sun et al. | |
| 2014/0363596 A1 | 12/2014 | Sun et al. | |
| 2014/0377504 A1 | 12/2014 | Sun et al. | |
| 2015/0021324 A1 | 1/2015 | Sun et al. | |
| 2015/0024155 A1 | 1/2015 | Sun et al. | |
| 2015/0075714 A1 | 3/2015 | Sun et al. | |
| 2015/0079370 A1 | 3/2015 | Sun et al. | |
| 2015/0133285 A1 | 5/2015 | Sun et al. | |
| 2015/0158775 A1 | 6/2015 | Sun et al. | |
| 2015/0218057 A1 | 8/2015 | Duan et al. | |
| 2015/0270108 A1 | 9/2015 | Sun et al. | |
| 2015/0275361 A1 | 10/2015 | Lubomirsky et al. | |
| 2015/0275375 A1 | 10/2015 | Kim et al. | |
| 2015/0299050 A1 | 10/2015 | Sun et al. | |
| 2015/0307982 A1* | 10/2015 | Firouzdor | C23C 14/024 428/138 |
| 2015/0311043 A1* | 10/2015 | Sun | C23C 4/12 428/335 |
| 2015/0321964 A1 | 11/2015 | Sun et al. | |
| 2015/0329430 A1 | 11/2015 | Sun et al. | |
| 2015/0329955 A1 | 11/2015 | Sun et al. | |
| 2016/0042924 A1* | 2/2016 | Kim | H01J 37/32559 313/231.31 |
| 2016/0111684 A1 | 4/2016 | Savas et al. | |
| 2016/0318807 A1 | 11/2016 | Sun et al. | |
| 2016/0326060 A1 | 11/2016 | Sun et al. | |
| 2016/0326061 A1 | 11/2016 | Sun et al. | |
| 2017/0130319 A1* | 5/2017 | Sun | B65D 43/02 |
| 2017/0133207 A1* | 5/2017 | Sun | B65D 43/02 |
| 2017/0301522 A1* | 10/2017 | Sun | C23C 14/0031 |

FOREIGN PATENT DOCUMENTS

| | | | |
|---|---|---|---|
| KR | 10-2003-0025007 | 3/2003 | |
| KR | 10-2007-0013118 | 1/2007 | |
| KR | 101108692 B1 | 1/2012 | |
| WO | 02/00968 A1 | 1/2002 | |
| WO | WO 2012/033326 A2 * | 3/2012 | C23C 24/04 |
| WO | 2013126466 A1 | 8/2013 | |
| WO | 2013155220 A1 | 10/2013 | |
| WO | 2013162909 A1 | 10/2013 | |
| WO | 2014018830 A1 | 1/2014 | |
| WO | 2014018835 A1 | 1/2014 | |
| WO | WO2014190211 A1 | 11/2014 | |
| WO | WO2014197203 A1 | 12/2014 | |
| WO | WO2014205212 A1 | 12/2014 | |
| WO | WO2015009745 A1 | 1/2015 | |
| WO | WO2015013070 A1 | 1/2015 | |
| WO | WO2015042196 A1 | 3/2015 | |
| WO | WO2015073458 A1 | 5/2015 | |
| WO | WO2015153123 A1 | 10/2015 | |
| WO | WO2015164263 A1 | 10/2015 | |
| WO | WO2015164638 A1 | 10/2015 | |
| WO | WO2015171801 A1 | 11/2015 | |
| WO | WO2015175987 A1 | 11/2015 | |

OTHER PUBLICATIONS

Kitamura et al.; "Structural, Mechanical and Erosion Properties of Yttrium Oxide Coatings by Axial Suspension Plasma Spraying for Electronic Applications", Journal of Thermal Spraying Technology, vol. 20 (1-2), Jan. 2011; pp. 170-184.*

Refke et al.; "LPPS thin film technology for applications of TBC systems"; International Thermal Spray Conference, Basel Switzerland, May 2-4, 2005; (six pages).*

Richard J. Lewis, Sr., editor; Hawley's Condensed Chemical Dictionary, 12th edition; Van Nostrand Reinhold company, New York; 1993 (no month), excerpt pp. 540 & 990.*

International Search Report and Written Opinion for PCT/US2005/026677 dated Jul. 28, 2015.

Hass et al., "Gas jet assisted vapor deposition of yttria stabilized zirconia," Department of Materials Science and Engineering, School of Engineering and Applied Science, published Feb. 27, 2009 University of Virginia, Charlottesville, Virginia.

Hass et al., "Gas jet assisted vapor deposition of yttria stabilized zirconia,", published Feb. 27, 2009, Journal vacuum science technology A; vol. 27, No. 2; American chemical Society; pp. 404-414.

Greenwood, N.N. et al., "Chemistry of the Elements" (2nd Edition), 1998, p. 1295: Appendix 5: Effective Ionic Radii in pm for Various Oxidation States; online version available at app.knovel.com/hotlink/pdf/id:kt003BKDL1/chemistry-elements-2nd/effective-ionic-radii, Butterworth-Heinemann, Reed Educational & Professional publishing LTD.

Webster's Ninth New Collegiate Dictionary; Meriam-Webster Incorporated, publishers; Springfield, Massachusetts, USA; 1990 (no month); excerpt p. 189.

Wachtman, J.B. et al., ed. "Ceramic Films and Coatings", Ch. 6, "Optical Thin Films", copyright 1993, Noyes Publications, pp. 189-223. Online version available at: app.knovel.com/hotlink/pdf/ld:kt00194M71/ceramic-films-coatings/optical-thin-films.

* cited by examiner

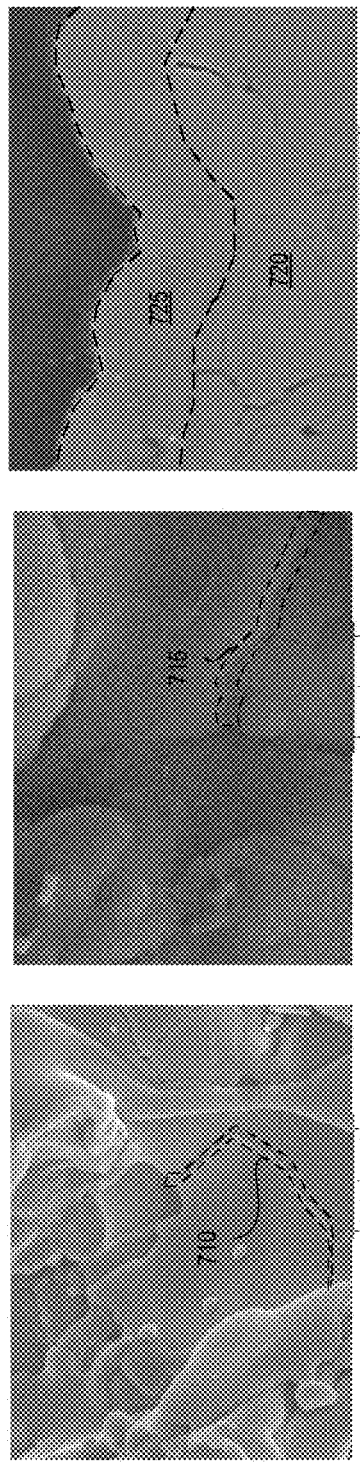
FIG. 7A
FIG. 7B
FIG. 7C
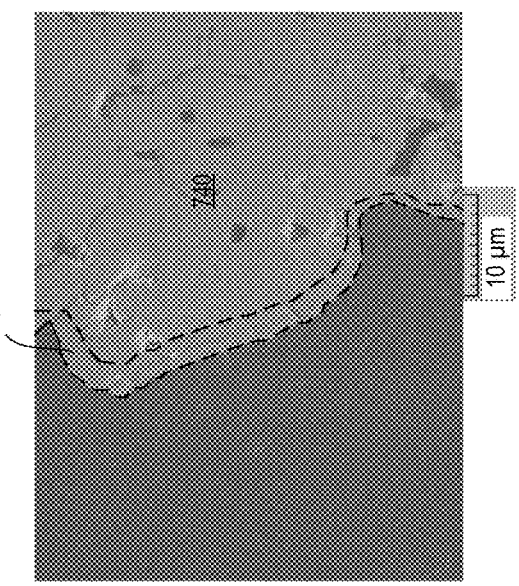
FIG. 7E
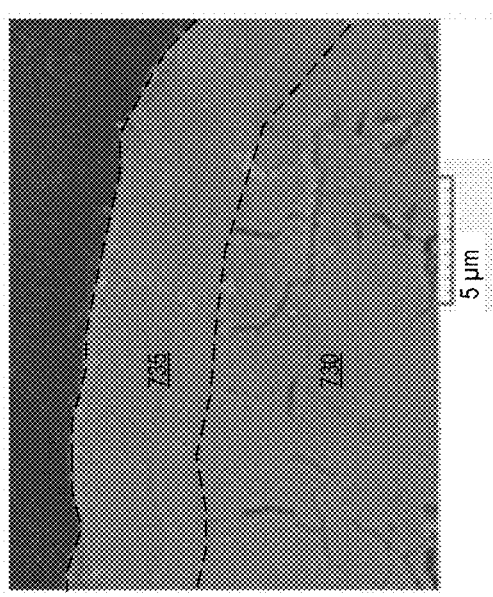
FIG. 7D

US 9,869,013 B2

ION ASSISTED DEPOSITION TOP COAT OF RARE-EARTH OXIDE

TECHNICAL FIELD

Embodiments of the present invention relate, in general, to chamber components having an ion assisted deposition (IAD) deposited thin film plasma resistant protective layer.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 7A-7E illustrate scanning electron microscope (SEM) images of articles having a thin film protective layer formed from a ceramic compound of $Y_4Al_2O_9$ and a solid-solution of $Y_2O_3$—$ZrO_2$ deposited over a plasma sprayed protective layer also formed from the ceramic compound of $Y_4Al_2O_9$ and a solid-solution of $Y_2O_3$—$ZrO_2$.

DETAILED DESCRIPTION OF EMBODIMENTS

Embodiments of the present invention provide an article such as a chamber component for an etch reactor having a thin film protective layer on one or more plasma facing surfaces of the article. The protective layer may have a thickness up to approximately 300 µm, and may provide plasma erosion resistance for protection of the article. The protective layer may be formed on the article using ion assisted deposition (IAD) (e.g., using electron beam IAD (EB-IAD) or ion beam sputtering IAD (IBS-IAD)) or physical vapor deposition (PVD). The thin film protective layer may be $Y_3Al_5O_{12}$, $Y_2O_3$, $Y_4Al_2O_9$, $Er_2O_3$, $Gd_2O_3$, $Er_3Al_5O_{12}$, $Gd_3Al_5O_{12}$, a ceramic compound comprising $Y_4Al_2O_9$ and a solid-solution of $Y_2O_3$—$ZrO_2$, or another rare-earth oxide. In one embodiment, IAD or PVD is performed using a metallic target, and the rare earth oxide is formed in situ. The improved erosion resistance provided by the thin film protective layer may improve the service life of the article, while reducing maintenance and manufacturing cost. Additionally, the IAD coating can be deposited as a top coat over a plasma sprayed coating. The IAD coating can seal pores and cracks in the plasma sprayed coating to significantly reduce an amount of reactivity of process gases with the chamber component as well as a level of trace metal contamination. The IAD coating can also embed any loose particles that were on the plasma sprayed coating to reduce particle defects.

Figure 1:
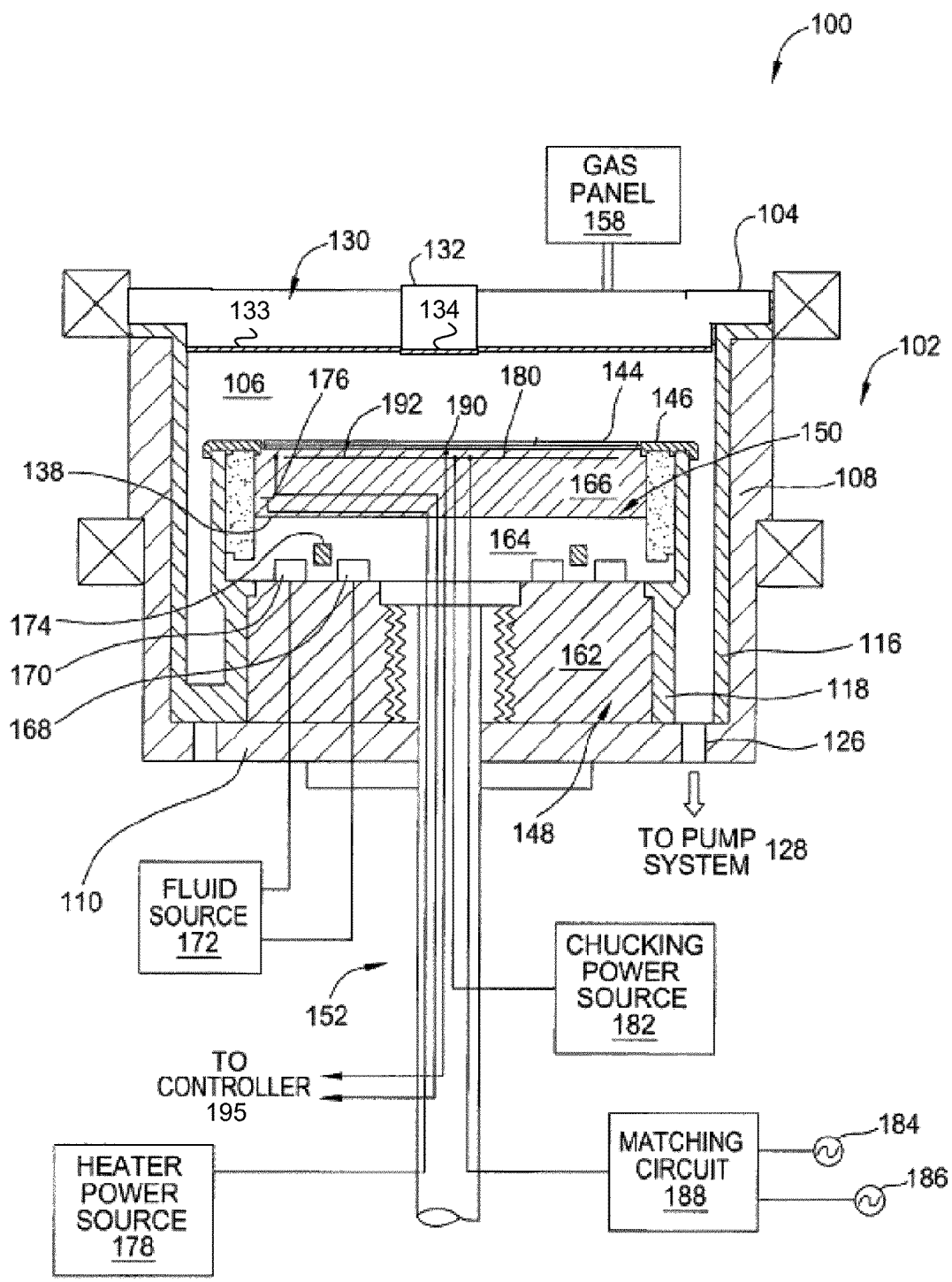
FIG. 1 depicts a sectional view of one embodiment of a processing chamber.

FIG. 1 is a sectional view of a semiconductor processing chamber 100 having one or more chamber components that are coated with a thin film protective layer in accordance with embodiments of the present invention. The processing chamber 100 may be used for processes in which a corrosive plasma environment is provided. For example, the processing chamber 100 may be a chamber for a plasma etch reactor (also known as a plasma etcher), a plasma cleaner, and so forth. Examples of chamber components that may include a thin film protective layer include a substrate support assembly 148, an electrostatic chuck (ESC) 150, a ring (e.g., a process kit ring or single ring), a chamber wall, a base, a gas distribution plate, a showerhead, a chamber liner, a liner kit, a shield, a plasma screen, a flow equalizer, a cooling base, a chamber viewport, a chamber lid 104, a nozzle, a flow equalizer (FEQ), and so on. In one particular embodiment, the protective layer is applied over a chamber lid 104 and/or a chamber nozzle 132.

The thin film protective layer, which is described in greater detail below, is a rare earth oxide layer deposited by ion assisted deposition (IAD) or physical vapor deposition (PVD). The thin film protective layer may include $Y_2O_3$ and $Y_2O_3$ based rare earth oxide composites, $Er_2O_3$ and $Er_2O_3$ based rare earth oxide composites, $Gd_2O_3$ and $Gd_2O_3$ based rare earth oxide composites, $Nd_2O_3$ and $Nd_2O_3$ based ceramics, Er based rare earth oxide composites, Ga based rare earth oxide composites, or AlN. In various embodiments, the thin film protective layer may be composed of $Y_3Al_5O_{12}$ (YAG), $Y_4Al_2O_9$ (YAM), $Er_3Al_5O_{12}$ (EAG), $Gd_3Al_5O_{12}$ (GAG), $YAlO_3$ (YAP), $Er_4Al_2O_9$ (EAM), $ErAlO_3$ (EAP), $Gd_4Al_2O_9$ (GdAM), $GdAlO_3$ (GdAP), $Nd_3Al_5O_{12}$ (NdAG), $Nd_4Al_2O_9$ (NdAM), $NdAlO_3$ (NdAP), and/or a ceramic compound comprising $Y_4Al_2O_9$ and a solid-solution of $Y_2O_3$—$ZrO_2$. The thin film protective layer may also be Er—Y compositions (e.g., Er 80 wt % and Y 20 wt %), Er—Al—Y compositions (e.g., Er 70 wt %, Al 10 wt %, and Y 20 wt %), Er—Y—Zr compositions (e.g., Er 70 wt %, Y 20 wt % and Zr 10 wt %), or Er—Al compositions (e.g., Er 80 wt % and Al 20 wt %). Note that wt % means percentage by weight. In contrast, mol % is molar ratio.

The thin film protective layer may also be based on a solid solution formed by any of the aforementioned ceramics. With reference to the ceramic compound comprising $Y_4Al_2O_9$ and a solid-solution of $Y_2O_3$—$ZrO_2$, in one embodiment, the ceramic compound includes 62.93 molar ratio (mol %) $Y_2O_3$, 23.23 mol % $ZrO_2$ and 13.94 mol %

$Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the ceramic compound can include $Y_2O_3$ in a range of 40-100 mol %, $ZrO_2$ in a range of 0-60 mol % and $Al_2O_3$ in a range of 0-10 mol %. In another embodiment, the ceramic compound can include $Y_2O_3$ in a range of 40-60 mol %, $ZrO_2$ in a range of 30-50 mol % and $Al_2O_3$ in a range of 10-20 mol %. In another embodiment, the ceramic compound can include $Y_2O_3$ in a range of 40-50 mol %, $ZrO_2$ in a range of 20-40 mol % and $Al_2O_3$ in a range of 20-40 mol %. In another embodiment, the ceramic compound can include $Y_2O_3$ in a range of 70-90 mol %, $ZrO_2$ in a range of 0-20 mol % and $Al_2O_3$ in a range of 10-20 mol %. In another embodiment, the ceramic compound can include $Y_2O_3$ in a range of 60-80 mol %, $ZrO_2$ in a range of 0-10 mol % and $Al_2O_3$ in a range of 20-40 mol %. In another embodiment, the ceramic compound can include $Y_2O_3$ in a range of 40-60 mol %, $ZrO_2$ in a range of 0-20 mol % and $Al_2O_3$ in a range of 30-40 mol %. In other embodiments, other distributions may also be used for the ceramic compound.

In one embodiment, an alternative ceramic compound that includes a combination of $Y_2O_3$, $ZrO_2$, $Er_2O_3$, $Gd_2O_3$ and $SiO_2$ is used for the protective layer. In one embodiment, the alternative ceramic compound can include $Y_2O_3$ in a range of 40-45 mol %, $ZrO_2$ in a range of 0-10 mol %, $Er_2O_3$ in a range of 35-40 mol %, $Gd_2O_3$ in a range of 5-10 mol % and $SiO_2$ in a range of 5-15 mol %. In a first example, the alternative ceramic compound includes 40 mol % $Y_2O_3$, 5 mol % $ZrO_2$, 35 mol % $Er_2O_3$, 5 mol % $Gd_2O_3$ and 15 mol % $SiO_2$. In a second example, the alternative ceramic compound includes 45 mol % $Y_2O_3$, 5 mol % $ZrO_2$, 35 mol % $Er_2O_3$, 10 mol % $Gd_2O_3$ and 5 mol % $SiO_2$. In a third example, the alternative ceramic compound includes 40 mol % $Y_2O_3$, 5 mol % $ZrO_2$, 40 mol % $Er_2O_3$, 7 mol % $Gd_2O_3$ and 8 mol % $SiO_2$.

In one embodiment, an alternative ceramic compound that includes a combination of $Y_2O_3$, $ZrO_2$, $Er_2O_3$, and $Al_2O_3$ is used for the protective layer. In one embodiment, the alternative ceramic compound includes 25 mol % $Y_2O_3$, 25 mol % $ZrO_2$, 25 mol % $Er_2O_3$, and 25 mol % $Al_2O_3$.

In one embodiment, an alternative ceramic compound that includes a combination of $Y_2O_3$, $Gd_2O_3$ and $Al_2O_3$ is used for the protective layer. The alternative ceramic compound may include 6.9-22.1 mol % $Y_2O_3$, 14.1-44.9 mol % $Gd_2O_3$, and 33.0-79 mol % $Al_2O_3$. In one embodiment, the alternative ceramic compound includes 22.1 mol % $Y_2O_3$, 44.9 mol % $Gd_2O_3$ and 33.0 mol % $Al_2O_3$. In another embodiment, the alternative ceramic compound includes 16.5 mol % $Y_2O_3$, 33.5 mol % $Gd_2O_3$ and 50.0 mol % $Al_2O_3$. In another embodiment, the alternative ceramic compound includes 12.5 mol % $Y_2O_3$, 25.5 mol % $Gd_2O_3$ and 62.0 mol % $Al_2O_3$. In another embodiment, the alternative ceramic compound includes 6.9 mol % $Y_2O_3$, 14.1 mol % $Gd_2O_3$ and 79.0 mol % $Al_2O_3$.

Any of the aforementioned thin film protective layers may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

The thin film protective layer may be an IAD coating applied over different ceramic articles including oxide based ceramics, Nitride based ceramics and Carbide based ceramics. Examples of oxide based ceramics include $SiO_2$ (quartz), $Al_2O_3$, $Y_2O_3$, and so on. Examples of Carbide based ceramics include SiC, Si—SiC, and so on. Examples of Nitride based ceramics include AlN, SiN, and so on. The thin film protective layer may also be an IAD coating applied over a plasma sprayed protective layer. The plasma sprayed protective layer may be $Y_3Al_5O_{12}$, $Y_2O_3$, $Y_4Al_2O_9$, $Er_2O_3$, $Gd_2O_3$, $Er_3Al_5O_{12}$, $Gd_3Al_5O_{12}$, a ceramic compound comprising $Y_4Al_2O_9$ and a solid-solution of $Y_2O_3$—$ZrO_2$, or another ceramic.

As illustrated, the lid 130 and nozzle 132 each have a thin film protective layer 133, 134, in accordance with one embodiment. However, it should be understood that any of the other chamber components, such as those listed above, may also include a thin film protective layer. For example, an inner liner and/or outer liner of the processing chamber 100 may include the thin film protective layer.

In one embodiment, the processing chamber 100 includes a chamber body 102 and a lid 130 that enclose an interior volume 106. The lid 130 may have a hole in its center, and a nozzle 132 may be inserted into the hole. The chamber body 102 may be fabricated from aluminum, stainless steel or other suitable material. The chamber body 102 generally includes sidewalls 108 and a bottom 110. Any of the lid 130, nozzle 132, sidewalls 108 and/or bottom 110 may include a plasma sprayed protective layer and/or a thin film protective layer that may act as a top coat over the plasma sprayed protective layer.

An outer liner 116 may be disposed adjacent the sidewalls 108 to protect the chamber body 102. The outer liner 116 may include a plasma sprayed protective layer and/or a thin film protective layer. In one embodiment, the outer liner 116 is fabricated from aluminum oxide. In one embodiment, the outer liner 116 is fabricated from an aluminum alloy (e.g., 6061 Aluminum) with a plasma sprayed $Y_2O_3$ protective layer. The thin film protective layer may act as a top coat over the $Y_2O_3$ protective layer on the outer liner.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 130 may be supported on the sidewall 108 of the chamber body 102. The lid 130 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the nozzle 132. The lid 130 may be a ceramic such as $Al_2O_3$, $Y_2O_3$, YAG, $SiO_2$, MN, SiN, SiC, Si—SiC, or a ceramic compound comprising $Y_4Al_2O_9$ and a solid-solution of $Y_2O_3$—$ZrO_2$. The nozzle 132 may also be a ceramic, such as any of those ceramics mentioned for the lid. The lid 130 and/or nozzle 132 may be coated with a thin film protective layer 133, 134, respectively.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). A substrate support assembly 148 is disposed in the interior volume 106 of the processing chamber 100 below the lid 130. The substrate support assembly 148 holds the substrate 144 during processing. A ring 146 (e.g., a single ring) may cover a portion of the electrostatic chuck 150, and may protect the covered portion from exposure to plasma during processing. The ring 146 may be silicon or quartz in one embodiment.

An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116. Additionally, the inner liner 118 may be coated with a plasma sprayed protective layer and/or an IAD deposited thin film protective layer.

In one embodiment, the substrate support assembly 148 includes a mounting plate 162 supporting a pedestal 152, and an electrostatic chuck 150. The electrostatic chuck 150 further includes a thermally conductive base 164 and an electrostatic puck 166 bonded to the thermally conductive base by a bond 138, which may be a silicone bond in one embodiment. The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolators 174 and/or conduits 168, 170 to control a lateral temperature profile of the support assembly 148. The conduits 168, 170 may be fluidly coupled to a fluid source 172 that circulates a temperature regulating fluid through the conduits 168, 170. The embedded isolator 174 may be disposed between the conduits 168, 170 in one embodiment. The heater 176 is regulated by a heater power source 178. The conduits 168, 170 and heater 176 may be utilized to control the temperature of the thermally conductive base 164, thereby heating and/or cooling the electrostatic puck 166 and a substrate (e.g., a wafer) 144 being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features, that may be formed in an upper surface of the puck 166. The gas passages may be fluidly coupled to a source of a heat transfer (or backside) gas such as He via holes drilled in the puck 166. In operation, the backside gas may be provided at controlled pressure into the gas passages to enhance the heat transfer between the electrostatic puck 166 and the substrate 144.

The electrostatic puck 166 includes at least one clamping electrode 180 controlled by a chucking power source 182. The electrode 180 (or other electrode disposed in the puck 166 or base 164) may further be coupled to one or more RF power sources 184, 186 through a matching circuit 188 for maintaining a plasma formed from process and/or other gases within the processing chamber 100. The sources 184, 186 are generally capable of producing RF signal having a frequency from about 50 kHz to about 3 GHz and a power of up to about 10,000 Watts.

Figure 2A:
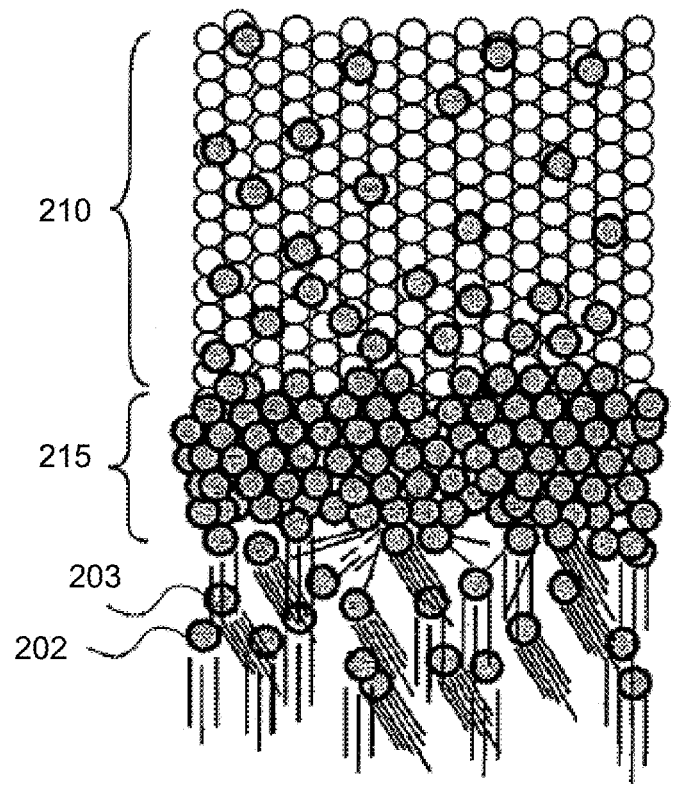
FIG. 2A depicts a deposition mechanism applicable to a variety of deposition techniques utilizing energetic particles such as ion assisted deposition (IAD).

FIG. 2A depicts a deposition mechanism applicable to a variety of deposition techniques utilizing energetic particles such as ion assisted deposition (IAD) and PVD. Some embodiments are discussed with reference to IAD. However, it should be understood that alternative embodiments may also be used with PVD deposition techniques. Exemplary IAD methods include deposition processes which incorporate ion bombardment, such as evaporation (e.g., activated reactive evaporation (ARE) or electron beam ion assisted deposition (EB-IAD)) and sputtering (e.g., ion beam sputtering ion assisted deposition (IBS-IAD)) in the presence of ion bombardment to form plasma resistant coatings as described herein. EB-IAD may be performed by evaporation. IBS-IAD may be performed by sputtering a solid target material.

As shown, the thin film protective layer 215 is formed on an article 210 or on multiple articles 210A, 210B by an accumulation of deposition materials 202 in the presence of energetic particles 203 such as ions (e.g., Oxygen ions or Nitrogen ions). The articles 210A, 210B may be metal (e.g., Aluminum alloys, stainless steel, etc.), ceramic (e.g., $Al_2O_3$, $Y_2O_3$, AlN, $SiO_2$, etc.), or polymer based materials. The articles 210A, 201B may already have a plasma spray coating such as a $Y_2O_3$ coating on at least one surface. The IAD or PVD process may be performed to provide a top coat over the plasma spray coating.

The deposition materials 202 may include atoms, ions, radicals, and so on. The energetic particles 203 may impinge and compact the thin film protective layer 215 as it is formed. Any of the IAD or PVD methods may be performed in the presence of a reactive gas species, such as $O_2$, $N_2$, halogens, etc. Such reactive species may burn off surface organic contaminants prior to and/or during deposition.

Figure 2B:
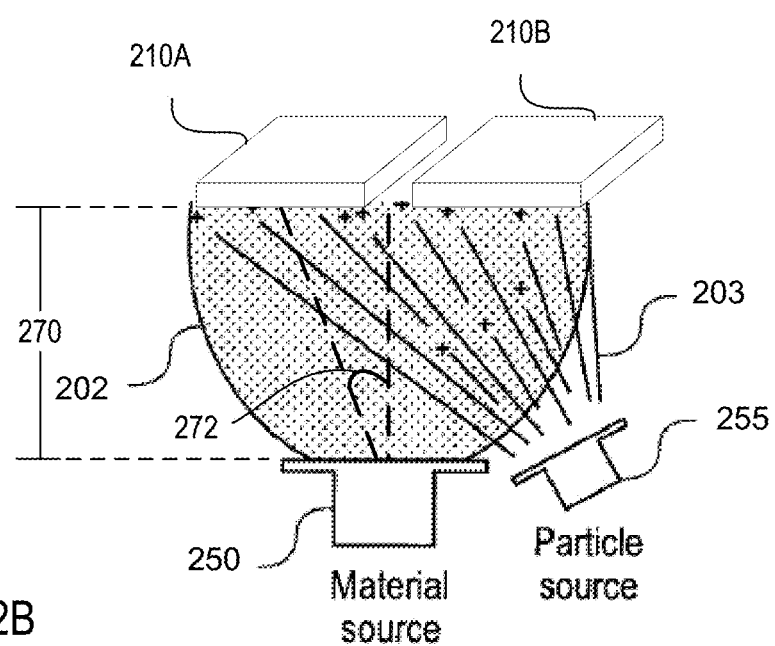
FIG. 2B depicts a schematic of an IAD deposition apparatus.

In one embodiment, EB-IAD is utilized to form the thin film protective layer 215. In another embodiment, IBS-IAD is utilized to form the thin film protective layer 215. Alternatively, PVD is utilized to form the thin film protective layer 215. FIG. 2B depicts a schematic of an IAD deposition apparatus. As shown, a material source 250 provides a flux of deposition materials 202 while an energetic particle source 255 provides a flux of the energetic particles 203, both of which impinge upon the article 210, 210A, 210B throughout the IAD process. The energetic particle source 255 may be an Oxygen, Nitrogen or other ion source. The energetic particle source 255 may also provide other types of energetic particles such as inert particles, radicals, atoms, and nano-sized particles which come from particle generation sources (e.g., from plasma, reactive gases or from the material source that provide the deposition materials).

IAD coating target material can be calcined powders, preformed lumps (e.g., formed by green body pressing, hot pressing, and so on), a sintered body (e.g., having 50-100% density), or a machined body (e.g., can be ceramic, metal, or a metal alloy). In one embodiment, the material source (e.g., target body) used to provide the deposition materials is a ceramic corresponding to the same ceramic that the thin film protective layer 215 is to be composed of. In one embodiment, the material source is a bulk sintered ceramic corresponding to the same ceramic that the thin film protective layer 215 is to be composed of. For example, the material source may be a bulk sintered ceramic compound body, or bulk sintered YAG, $Er_2O_3$, $Gd_2O_3$, $Er_3Al_5O_{12}$, or $Gd_3Al_5O_{12}$, or other mentioned ceramics. Other target materials may also be used, such as powders, calcined powders, preformed material (e.g., formed by green body pressing or hot pressing), or a machined body (e.g., fused material). All of the different types of material sources 250 are melted into molten material sources during deposition. However, different types of starting material take different amounts of time to melt. Fused materials and/or machined bodies may melt the quickest. Preformed material melts slower than fused materials, calcined powders melt slower than preformed materials, and standard powders melt more slowly than calcined powders.

In another embodiment, the material source (e.g., target body) used to provide the deposition materials is a metallic target. Use of a metallic target rather than a ceramic target typically increases the deposition rate for IAD or PVD deposited layers. The metallic target material may be evaporated or sputtered, and may react with one or more gases in situ to form a ceramic layer. In one embodiment, Oxygen or Nitrogen radicals are flowed into a deposition chamber during the IAD deposition. The evaporated or sputtered metal reacts with the Oxygen or Nitrogen radicals to form an oxide or nitride ceramic layer. For example, a Yttrium metal target may be evaporated or sputtered, and may react with Oxygen radicals to form a $Y_2O_3$ IAD deposited layer. In another example an Aluminum metal target is evaporated or sputtered and reacts with Nitrogen radicals to form an AlN IAD deposited layer. Other example rare earth metals that may be used as the target include Aluminum, Erbium, and Gadolinium.

To form complex oxide compositions, various metal alloys may be used as the target material. Some example metal alloys that may be used to deposit plasma resistant rare earth oxide layers include a Yttrium Zirconium alloy; a Yttrium, Zirconium, Aluminum alloy; an Erbium Aluminum alloy, a Gadolinium Aluminum alloy; a Yttrium, Erbium, Zirconium, Aluminum alloy; a Yttrium, Erbium, Zirconium, Gadolinium, Silicon alloy; and a Yttrium, Gadolinium, Aluminum alloy.

The flow rate of the Oxygen or Nitrogen radicals may be adjusted to control an Oxygen content or Nitrogen content in the thin film protective layer 215 that is formed. In one embodiment, a low flow rate of Oxygen or Nitrogen radicals is initially used to deposit a metallic type coating that has a low concentration of Oxygen or Nitrogen. This may minimize or eliminate any mismatch stress induced by physical property differences between the thin film protective layer 215 and the article 210. The flow rate of Oxygen or Nitrogen radicals may be gradually increased as the deposition process continues. The flow rate may be increased linearly, exponentially, or logarithmically during the deposition process for example. The top of the thin film protective layer 215 may then have a high concentration of Oxygen or Nitrogen, and be an oxide or nitride. For example, a deposition can be started over a substrate made of an aluminum alloy by evaporation of Al metal. After 1 µm of deposition of an essentially Aluminum coating with a minimal concentration of Oxygen, the concentration of Oxygen radicals inside the chamber may be increased to cause another 1 µm of deposition to be Al with a larger concentration of Oxygen, and the concentration of Oxygen radicals inside the chamber may be further increased to cause the rest of the coating to be $Al_2O_3$. The ion assist can also include an inert gas ion (e.g., Ar). If the material loses oxygen during evaporation and deposition, the oxygen deficiency can be compensated by bleeding oxygen into the chamber.

IAD may utilize one or more plasmas or beams (e.g., electron beams) to provide the material and energetic ion sources. Reactive species may also be provided during deposition of the plasma resistant coating. In one embodiment, the energetic particles 203 include at least one of non-reactive species (e.g., Ar) or reactive species (e.g., O or N). For example, Oxygen ions or Nitrogen ions may be used to bombard the article 210 during the IAD deposition. These Oxygen or Nitrogen ions may additionally react with the evaporated or sputtered metal in situ. The bombardment of Oxygen or Nitrogen ions may be used instead of or in addition to the flowing of Oxygen or Nitrogen radicals into the processing chamber to react with the evaporated or sputtered metal in situ.

In further embodiments, reactive species such as CO and halogens (Cl, F, Br, etc.) may also be introduced during the formation of a plasma resistant coating to further increase the tendency to selectively remove deposited material most weakly bonded to the thin film protective layer 215.

With IAD processes, the energetic particles 203 may be controlled by the energetic ion (or other particle) source 255 independently of other deposition parameters. The energy (e.g., velocity), density and incident angle of the energetic ion flux may be adjusted to control a composition, structure, crystalline orientation and grain size of the thin film protective layer. Additional parameters that may be adjusted are a temperature of the article during deposition as well as the duration of the deposition.

The ion assist energy is used to densify the coating and to accelerate the deposition of the material on the surface of the substrate. Ion assist energy can be varied using both the voltage and current of the ion source. The voltage and current can be adjusted to achieve high and low coating density, to manipulate a stress of the coating and also a crystallinity of the coating. The ion assist energy may range from approximately 50-500 Volts (V) and approximately 1-50 amps (A). The ion assist energy can also be used to intentionally change a stoichiometry of the coating. For example, a metallic target can be used during deposition, and converted to a metal oxide.

Coating temperature can be controlled by using heaters to heat a deposition chamber and/or a substrate and by adjusting a deposition rate. In one embodiment, an IAD deposition chamber (and the article therein) is heated to a starting temperature of 160° C. or higher prior to deposition. In one embodiment, the starting temperature is 160° C. to 500° C. In one embodiment, the starting temperature is 200° C. to 270° C. The temperature of the chamber and of the article may then be maintained at the starting temperature during deposition. In one embodiment, the IAD chamber includes heat lamps which perform the heating. In an alternative embodiment, the IAD chamber and article are not heated. If the chamber is not heated, it will naturally increase in temperature to about 160° C. as a result of the IAD process. A higher temperature during deposition may increase a density of the protective layer but may also increase a mechanical stress of the protective layer. Active cooling can be added to the chamber to maintain a low temperature during coating. The low temperature may be maintained at any temperature at or below 160° C. down to 0° C. in one embodiment. In one embodiment, the article is cooled to maintain a temperature at or below 150° C. during deposition. The article may be maintained at or below 150° C. to prevent the plasma sprayed protective layer from delaminating from the article during the IAD deposition. Deposition temperature can be used to adjust film stress, crystallinity, and other coating properties.

Additional parameters that may be adjusted are working distance 270 and angle of incidence 272. The working distance 270 is the distance between the material source 250 and the article 210A, 210B. In one embodiment, the working distance is 0.2 to 2.0 meters, with a working distance of at or below 1.0 meters in one particular embodiment. Decreasing the working distance increases a deposition rate and increases an effectiveness of the ion energy. However, decreasing the working distance below a particular point may reduce a uniformity of the protective layer. The working distance can be varied to achieve a coating with a highest uniformity. Additionally, working distance may affect deposition rate and density of the coating. In one embodiment, a working distance of less than 1.0 meters is used to provide an increased deposition rate at the expense of introducing a non-uniformity of up to 5-10% into the thin film protective layer.

The angle of incidence is an angle at which the deposition materials 202 strike the articles 210A, 210B. The angle of incidence can be varied by changing the location and/or orientation of the substrate. In one embodiment the angle of incidence is 10-90 degrees, with an angle of incidence of about 30 degrees in one particular embodiment. By optimizing the angle of incidence, a uniform coating in three dimensional geometries can be achieved.

IAD coatings can be applied over a wide range of surface conditions with roughness from about 0.5 micro-inches (μin) to about 180 μin. However, smoother surface facilitates uniform coating coverage. The coating thickness can be up to about 1000 microns (μm). In production, coating thickness on components can be assessed by purposely adding a rare earth oxide based colored agent such $Nd_2O_3$, $Sm_2O_3$, $Er_2O_3$, etc. at the bottom of a coating layer stack. The thickness can also be accurately measured using ellipsometry.

IAD coatings can be amorphous or crystalline depending on the rare-earth oxide composite used to create the coating. For example EAG and YAG are amorphous coatings whereas $Er_2O_3$ and the ceramic compound comprising $Y_4Al_2O_9$ and a solid-solution of $Y_2O_3$—$ZrO_2$ are typically crystalline. Amorphous coatings are more conformal and reduce lattice mismatch induced epitaxial cracks whereas crystalline coatings are more erosion resistant.

Coating architecture can be a bi-layer or a multi-layer structure. In a bilayer architecture, an amorphous layer can be deposited as a buffer layer to minimize epitaxial cracks followed by a crystalline layer on the top which might be erosion resistant. In a multi-layer design, layer materials may be used to cause a smooth thermal gradient from the substrate to the top layer.

Co-deposition of multiple targets using multiple electron beam (e-beam) guns can be achieved to create thicker coatings as well as layered architectures. For example, two targets having the same material type may be used at the same time. Each target may be bombarded by a different electron beam gun. This may increase a deposition rate and a thickness of the protective layer. In another example, two targets may be different ceramic materials or different metallic materials. A first electron beam gun may bombard a first target to deposit a first protective layer, and a second electron beam gun may subsequently bombard the second target to form a second protective layer having a different material composition than the first protective layer. Alternatively, the two electron beam guns may bombard the two targets simultaneously to create a complex ceramic compound. Accordingly, two different metallic targets may be used rather than a single metal alloy to form a complex ceramic compound.

Post coating heat treatment can be used to achieve improved coating properties. For example, it can be used to convert an amorphous coating to a crystalline coating with higher erosion resistance. Another example is to improve the coating to substrate bonding strength by formation of a reaction zone or transition layer.

In one embodiment, articles are processed in parallel in an IAD chamber. For example, up to five lids and/or nozzles may be processed in parallel in one embodiment. Each article may be supported by a different fixture. Alternatively, a single fixture may be configured to hold multiple articles. The fixtures may move the supported articles during deposition.

In one embodiment, a fixture to hold an article such as a chamber liner can be designed out of metal components such as cold rolled steel or ceramics such as $Al_2O_3$, $Y_2O_3$, etc. The fixture may be used to support the chamber liner above or below the material source and electron beam gun. The fixture can have a chucking ability to chuck the lid and/or nozzle for safer and easier handling as well as during coating. Also, the fixture can have a feature to orient or align the chamber liner. In one embodiment, the fixture can be repositioned and/or rotated about one or more axes to change an orientation of the supported chamber liner to the source material. The fixture may also be repositioned to change a working distance and/or angle of incidence before and/or during deposition. The fixture can have cooling or heating channels to control the article temperature during coating. The ability or reposition and rotate the chamber liner may enable maximum coating coverage of 3D surfaces such as holes since IAD is a line of sight process.

TABLE 1

Material properties for IAD deposited YAG, $Er_2O_3$, EAG and ceramic compound comprising $Y_4Al_2O_9$ and a solid-solution of $Y_2O_3$—$ZrO_2$.

| Property | 92% $Al_2O_3$ | Ceramic Cmpd. | YAG | $Er_2O_3$ | EAG | $Y_2O_3$ | YZ20 |
|---|---|---|---|---|---|---|---|
| Crystal Structure | C | A | A | C | A | C | C |
| Breakdown Voltage (V) | 363 | 427 | 1223 | 527 (5 μm) | 900 (5 μm) | 1032 (5 μm) | 423 |
| Volume Resistivity (Ω · cm) | >0.01E16 | 4.1E16 | 11.3E16 | — | — | — | — |
| Dielectric Constant | 9.2 | 9.83 +/− 0.04 | 9.76 +/− 0.01 | 9.67 | 9.54 | — | — |
| Loss Tangent | 5E-4 | 4E-4 | 4E-4 | 4E-4 | 4E-4 | — | — |
| Thermal Conductivity (W/m-K) | 18 | 19.9 | 20.1 | 19.4 | 19.2 | — | — |
| Roughness (μin) | 8-16 | Same | Same | Same | Same | Same | Same |
| Adhesion Over 92% $Al_2O_3$ (MPa) | N/A | >28 | >28 | >28 | >28 | >28 | >28 |
| Hermicity (leak rate) (cm³/s) | <1E-6 | 1.2E-9 | 4.4E-10 | 5.5E-9 | 9.5E-10 | — | 1.6E-7 |

TABLE 1-continued

Material properties for IAD deposited YAG, Er$_2$O$_3$, EAG and ceramic compound comprising Y$_4$Al$_2$O$_9$ and a solid-solution of Y$_2$O$_3$—ZrO$_2$.

| Property | 92% Al$_2$O$_3$ | Ceramic Cmpd. | YAG | Er$_2$O$_3$ | EAG | Y$_2$O$_3$ | YZ20 |
|---|---|---|---|---|---|---|---|
| Hardness (GPa) | 12.14 | 7.825 | 8.5 | 5.009 | 9.057 | — | 5.98 |
| Wear Rate (nm/RFhr) | 0.2 | 0.14 | 0.28 | 0.113 | 0.176 | — | — |

Table 1 shows material properties for a substrate of 92% Al$_2$O$_3$ (alumina) and for various IAD thin film protective layers coating a substrate of 92% Al$_2$O$_3$. In the table "C" represents a crystalline structure and "A" represents an amorphous structure. As shown, the alumina substrate has a breakdown voltage of 363 Volts/mil (V/mil). In contrast, a 5 micron (μm) coating of the IAD deposited ceramic compound comprising Y$_4$Al$_2$O$_9$ and a solid-solution of Y$_2$O$_3$—ZrO$_2$ has a breakdown voltage of 427 V (much more than the normalized value of 363 Volts/mil for alumina). A 5 μm coating of the IAD deposited YAG has a breakdown voltage of 1223 V. A 5 μm coating of the IAD deposited Er$_2$O$_3$ has a breakdown voltage of 527 V. A 5 μm coating of the IAD deposited EAG has a breakdown voltage of 900 V. A 5 μm coating of the IAD deposited Y$_2$O$_3$ has a breakdown voltage of 1032 V. A 5 μm coating of the IAD deposited YZ20 has a breakdown voltage of 423 V.

A volume resistivity of the alumina is around 0.01×10$^{16}$ (0.01E16) Ω·cm at room temperature. A volume resistivity of the ceramic compound thin film protective layer is about 4.1E16 Ω·cm at room temperature, and a volume resistivity of the YAG thin film protective layer is about 11.3E16 Ω·cm at room temperature.

A dielectric constant of the alumina is about 9.2, a dielectric constant of the ceramic compound thin film is about 9.83, a dielectric constant of the YAG thin film is about 9.76, a dielectric constant of the Er$_2$O$_3$ thin film is about 9.67, and a dielectric constant of the EAG thin film is about 9.54. A loss tangent of the alumina is about 5E-4, a loss tangent of the ceramic compound thin film is about 4E-4, a loss tangent of the YAG thin film is about 4E-4, a loss tangent of the Er$_2$O$_3$ thin film is about 4E-4, and a loss tangent of the EAG thin film is about 4E-4. A thermal conductivity of the 92% alumina is about 18 W/m-K. A thermal conductivity of a stack of a 5 μm coating of the ceramic compound thin film over 92% alumina is about 19.9 W/m-K. A thermal conductivity of a stack of a 5 μm coating of the YAG thin film over 92% alumina is about 20.1 W/m-K. A thermal conductivity of a stack of a 5 μm coating of the Er$_2$O$_3$ thin film over 92% alumina is about 19.4 W/m-K. A thermal conductivity of a stack of a 5 μm coating of the EAG thin film over 92% alumina is about 19.2 W/m-K.

The alumina substrate may have a starting roughness of approximately 8-16 micro-inches in one embodiment, and that starting roughness may be approximately unchanged in all of the thin film protective layers. In an example, an article with a plasma sprayed coating of the ceramic compound comprising Y$_4$Al$_2$O$_9$ and a solid-solution of Y$_2$O$_3$—ZrO$_2$ has a relatively high surface roughness. The surface of the plasma sprayed coating may have an arithmetic mean waviness (Wa) of 211 microinches (μinch) with a standard deviation (STDEV) of 43, an arithmetic mean roughness (Ra) of 230 μinch with a STDEV of 14, an average length (RSm) of 272 μm with a STDEV of 69, a standard height (Rc) of 19 μm with a STDEV of 5, and a surface area of 1,726,330 μm$^2$ with a STDEV of 37,336. After deposition of a 5 μm thick thin film protective layer of the ceramic compound comprising Y$_4$Al$_2$O$_9$ and a solid-solution of Y$_2$O$_3$—ZrO$_2$, each of these roughness metrics may be reduced. In the provided example, Wa is reduced to 187 μinch with a STDEV of 35, Ra is reduced to 191 μinch with a STDEV of 30, RSm is reduced to 178 μm with a STDEV of 34, Rc is reduced to 17 μm with a STDEV of 3.7, and the surface area is reduced to 1,695,045 μm$^2$ with a STDEV of 258,900. Wa measures an average absolute deviation of waviness irregularities. Ra measures average absolute deviation of roughness irregularities. Sa measures surface area of a curve. Rc measures an average value of height in a curve element. RSm measures an average value of the length of a curve element.

Adhesion strength of the thin film protective layers to the alumina substrate may be above 28 mega pascals (MPa) for the ceramic compound thin film and above 32 MPa for the YAG thin film. Adhesion strength may be determined by measuring the amount of force used to separate the thin film protective layer from the substrate. Hermicity measures the sealing capacity that can be achieved using the thin film protective layer. As shown, a He leak rate of around 1E-6 cubic centimeters per second (cm$^3$/s) can be achieved using alumina, a He leak rate of around 1.2E-9 can be achieved using the ceramic compound, a He leak rate of around 4.4E-10 can be achieved using YAG, a He leak rate of around 5.5E-9 can be achieved using Er$_2$O$_3$, a He leak rate of around 1.6E-7 can be achieved using YZ20, and a He leak rate of around 9.5E-10 can be achieved using EAG. Lower He leak rates indicate an improved seal. Each of the example thin film protective layers has a lower He leak rate than typical Al$_2$O$_3$.

Each of Y$_3$Al$_5$O$_{12}$, Y$_4$Al$_2$O$_9$, Er$_2$O$_3$, Gd$_2$O$_3$, Er$_3$Al$_5$O$_{12}$, Gd$_3$Al$_5$O$_{12}$, and the ceramic compound comprising Y$_4$Al$_2$O$_9$ and a solid-solution of Y$_2$O$_3$—ZrO$_2$ have a high hardness that may resist wear during plasma processing. As shown, alumina has a Vickers hardness (5 Kgf) of around 12.14 Giga pascals (GPa), the ceramic compound has a hardness of around 7.825 GPa, YAG has a hardness of around 8.5 GPa, Er$_2$O$_3$ has a hardness of around 5.009 GPa, YZ20 has a hardness of around 5.98 GPa, and EAG has a hardness of around 9.057 GPa, A measured wear rate of alumina is around 0.2 nanometers per radio frequency hour (nm/RFhr), a wear rate of the ceramic compound is about 0.14 nm/RFhr, a wear rate of Er$_2$O$_3$ is about 0.113 nm/RFhr, and a wear rate of EAG is about 0.176 nm/RFhr.

Note that the Y$_3$Al$_5$O$_{12}$, Y$_4$Al$_2$O$_9$, Er$_2$O$_3$, Gd$_2$O$_3$, Er$_3$Al$_5$O$_{12}$, Gd$_3$Al$_5$O$_{12}$, and the ceramic compound may be modified such that the material properties and characteristics identified above may vary by up to 30% in some embodiments. Accordingly, the described values for these material properties should be understood as example achievable values. The ceramic thin film protective layers described herein should not be interpreted as being limited to the provided values.

Figure 3A:
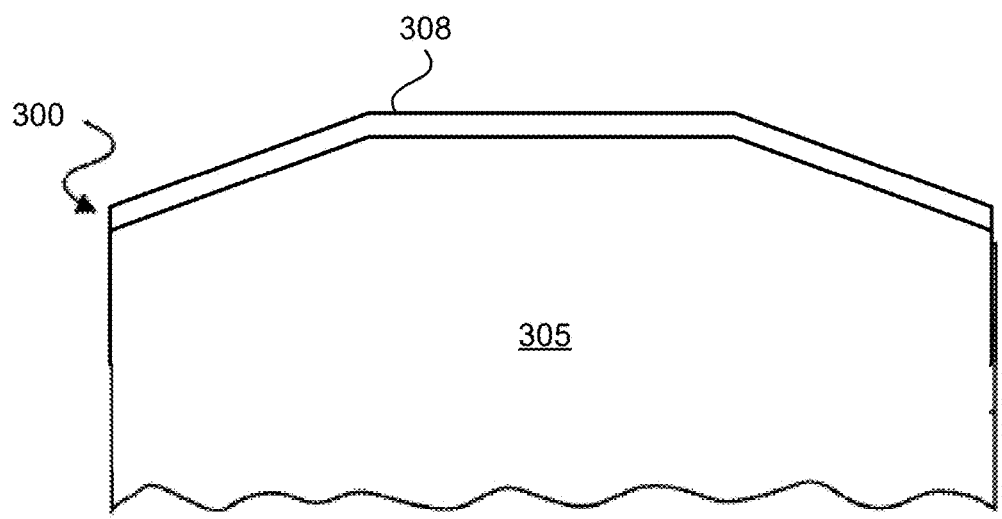
FIGS. 3A-4C illustrate cross sectional side views of articles covered by one or more thin film protective layers.

FIGS. 3A-4C illustrate cross sectional side views of articles (e.g., chamber components) covered by one or more thin film protective layers. Referring to FIG. 3A, at least a portion of a base or body 305 of an article 300 is coated by a thin film protective layer 308. The article 300 may be a chamber component, such as a substrate support assembly, an electrostatic chuck (ESC), a ring (e.g., a process kit ring or single ring), a chamber wall, a base, a gas distribution plate or showerhead, a chamber liner, a liner kit, a shield, a plasma screen, a flow equalizer, a cooling base, a chamber viewport, a chamber lid, and so on. The body 305 of the article 300 may be a metal, a ceramic, a metal-ceramic composite, a polymer, or a polymer-ceramic composite.

Various chamber components are composed of different materials. For example, an electrostatic chuck may be composed of a ceramic such as $Al_2O_3$ (alumina), AlN (aluminum nitride), TiO (titanium oxide), TiN (titanium nitride) or SiC (silicon carbide) bonded to an anodized aluminum base. $Al_2O_3$, AlN and anodized aluminum have poor plasma erosion resistance. When exposed to a plasma environment with a Fluorine chemistry and/or reducing chemistry, an electrostatic puck of an electrostatic chuck may exhibit degraded wafer chucking, increased He leakage rate, wafer front-side and back-side particle production and on-wafer metal contamination after about 50 radio frequency hours (RFHrs) of processing. A radio frequency hour is an hour of processing.

A lid for a plasma etcher used for conductor etch processes may be a sintered ceramic such as $Al_2O_3$ since $Al_2O_3$ has a high flexural strength and high thermal conductivity. However, $Al_2O_3$ exposed to Fluorine chemistries forms AlF particles as well as aluminum metal contamination on wafers. Some chamber lids have a thick film protective layer on a plasma facing side to minimize particle generation and metal contamination and to prolong the life of the lid. However, most thick-film coatings have inherent cracks and pores that might degrade on-wafer defect performance.

A process kit ring and a single ring are used to seal and/or protect other chamber components, and are typically manufactured from quartz or silicon. These rings may be disposed around a supported substrate (e.g., a wafer) to ensure a uniform plasma density (and thus uniform etching). However, quartz and silicon have very high erosion rates under various etch chemistries (e.g., plasma etch chemistries). Additionally, such rings may cause particle contamination when exposed to plasma chemistries. The process kit ring and single ring may also consist of sintered ceramics such as YAG and or ceramic compound comprising $Y_4Al_2O_9$ and a solid-solution of $Y_2O_3$—$ZrO_2$.

The showerhead for an etcher used to perform dielectric etch processes is typically made of anodized aluminum bonded to a SiC faceplate. When such a showerhead is exposed to plasma chemistries including fluorine, AlF may form due to plasma interaction with the anodized aluminum base. Additionally, a high erosion rate of the anodized aluminum base may lead to arcing and ultimately reduce a mean time between cleaning for the showerhead.

A chamber viewport (also known as an endpoint window) is a transparent component typically made of quartz or sapphire. Various optical sensors may be protected by the viewport, and may make optical sensor readings through the viewport. Additionally, a viewport may enable a user to visually inspect or view wafers during processing. Both quartz and sapphire have poor plasma erosion resistance. As the plasma chemistry erodes and roughens the viewport, the optical properties of the viewport change. For example, the viewport may become cloudy and/or an optical signal passing through the viewport may become skewed. This may impair an ability of the optical sensors to collect accurate readings. However, thick film protective layers may be inappropriate for use on the viewport because these coatings may occlude the viewport.

Chamber liners are conventionally made out of an aluminum alloy (e.g., 6061 Aluminum) with a plasma sprayed Yttrium based coating for erosion and corrosion protection. The plasma spray coating is a rough porous coating with a significant amount of cracking, pores and loose particles. Process gasses may penetrate the plasma sprayed coating via the cracks and holes to react with the aluminum alloy. This introduces metal contamination inside of the chamber. Additionally, the porous plasma sprayed coating may absorb process gasses during processing. The absorption of process gasses may occur at the initiation of a process, and may reduce an amount of process gasses that are available for processing a first few wafers. This effect is known as the "first wafer effect." The first wafer effect may be minimized or eliminated by applying a top coat of a thin film protective layer over the plasma sprayed coating.

The examples provided above set forth just a few chamber components whose performance may be improved by use of a thin film protective layer as set forth in embodiments herein.

Referring back to FIG. 3A, a body 305 of the article 300 may include one or more surface features, such as the mesa illustrated in FIG. 3A. For an electrostatic chuck, surface features may include mesas, sealing bands, gas channels, helium holes, and so forth. For a showerhead, surface features may include a bond line, hundreds or thousands of holes for gas distribution, divots or bumps around gas distribution holes, and so forth. Other chamber components may have other surface features.

The thin film protective layer 308 formed on the body 305 may conform to the surface features of the body 305. As shown, the thin film protective layer 308 maintains a relative shape of the upper surface of the body 305 (e.g., telegraphing the shapes of the mesa). Additionally, the thin film coating may be thin enough so as not to plug holes in the showerhead or He holes in the electrostatic chuck. In one embodiment, the thin film protective layer 308 has a thickness of below about 1000 microns. In one embodiment, the thin film protective layer 308 has a thickness of below about 50 microns. In a further embodiment, the thin film protective layer has a thickness of below about 20 microns. In a further embodiment, the thin film protective layer has a thickness of between about 0.5 microns to about 7 microns.

The thin film protective layer 308 is a deposited ceramic layer that may be formed on the body 305 of the article 300 using an ion assisted deposition (IAD) process or a physical vapor deposition (PVD) process. The IAD or PVD deposited thin film protective layer 308 may have a relatively low film stress (e.g., as compared to a film stress caused by plasma spraying or sputtering). The relatively low film stress may cause the lower surface of the body 305 to be very flat, with a curvature of less than about 50 microns over the entire body for a body with a 12 inch diameter. The IAD or PVD deposited thin film protective layer 308 may additionally have a porosity that is less than 1%, and less than about 0.1% in some embodiments. Therefore, the IAD or PVD deposited protective layer is a dense structure, which can have performance benefits for application on a chamber component.

Additionally, the IAD or PVD deposited protective layer 308 may be deposited without first roughening the upper surface of the body 305 or performing other time consuming surface preparation steps. Since roughening the body may reduce a breakdown voltage of the body 305, the ability to apply the thin film protective layer 308 without first roughening the body 305 may be beneficial for some applications (e.g., for an electrostatic chuck).

Figure 3B:
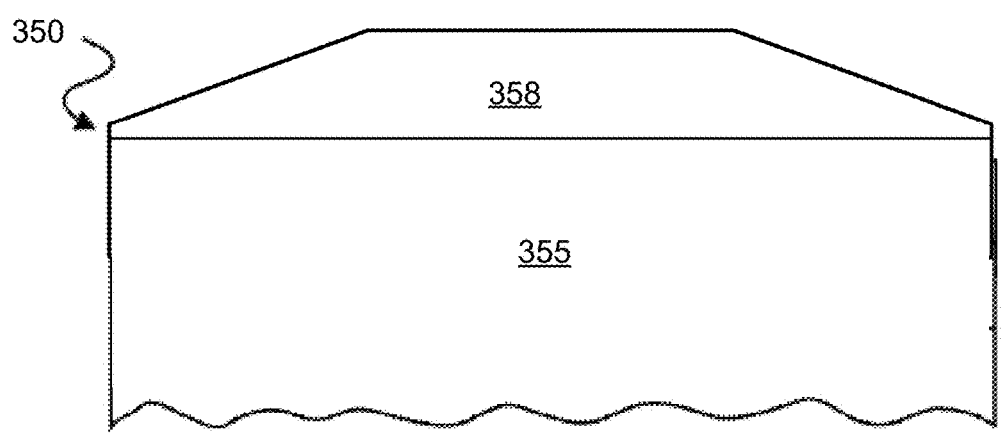

FIG. 3B illustrates a cross sectional side view of one embodiment of an article 350 having a body 355 coated by a thin film protective layer 358. As shown, the body 355 may be devoid of features. In one embodiment, the body 355 is polished prior to deposition of the thin film protective layer 358. Rather than having features in the body 355, features may be formed in the thin film protective layer 358. For example, the thin film protective layer 358 may be masked and then etched or bead blasted to remove unmasked portions of the thin film protective layer 358. The features can also be formed by masking the substrate and then applying the thin coating. Formed features may include mesas, channels, seal rings, exposed bond lines (e.g., of a showerhead), and so forth. Additionally, holes may be drilled in the thin film protective layer, such as by laser drilling. If features are to be formed in the thin film protective layer 358, the thin film protective layer should preferably have a thickness that is great enough to accommodate the features. For example, if 12 μm mesas are to be formed in the thin film protective layer, then the thin film protective layer 358 should have a thickness that is greater than 12 μm. In other embodiments, some features may be formed in the body 355, and other features may be formed in the thin film protective layer 358.

Figure 4A:
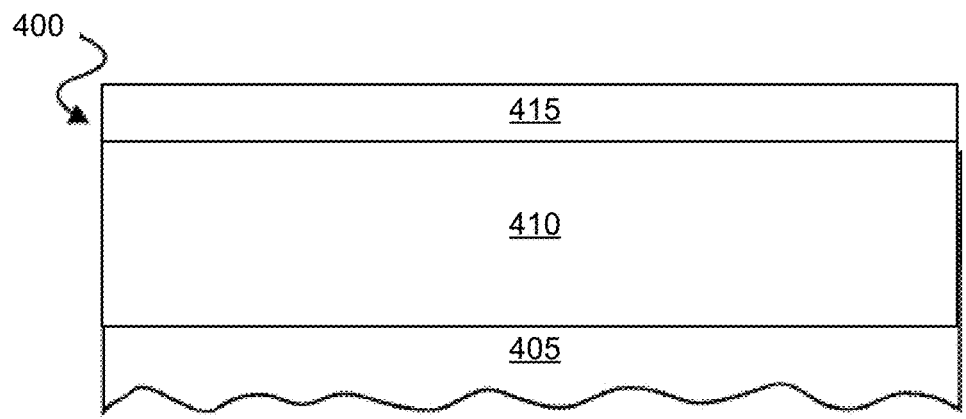

FIG. 4A illustrates a cross sectional side view of one embodiment of an article 400 having a thick protective layer 410 and a thin film protective layer 415 coating at least one surface of a body 405. The thick protective layer 410 may be a $Y_3Al_5O_{12}$, $Y_4Al_2O_9$, $Y_2O_3$, or the ceramic compound comprising $Y_4Al_2O_9$ and a solid-solution of $Y_2O_3$—$ZrO_2$. Other plasma resistant ceramics may also be used for the thick protective layer 410.

The thick protective layer 410 may be a thick film protective layer, which may have been thermally sprayed (e.g., plasma sprayed) onto the body 405. An upper surface of the body 405 may be roughened prior to plasma spraying the thick film protective layer onto it. The roughening may be performed, for example, by bead blasting the body 405. Roughening the upper surface of the body provides anchor points to create a mechanical bond between the plasma sprayed thick film protective layer and the body 405 for better adhesion. The thick film protective layer may have an as sprayed thickness of up to about 200 microns or thicker, and may be ground down to a final thickness of approximately 50 microns in some embodiments. A plasma sprayed thick film protective layer may have a porosity of about 2-4%.

Alternatively, the thick protective layer 410 may be a bulk sintered ceramic that has been bonded to the body 405. The thick protective layer 410 may be provided, for example, as a thin ceramic wafer having a thickness of approximately 200 microns.

The thin film protective layer 415 may be applied over the thick protective layer 410 using IAD or PVD. The thin film protective layer 415 may act as a top coat, and may act as an erosion resistant barrier and seal an exposed surface of the thick protective layer 410 (e.g., seal inherent surface cracks and pores in the thick protective layer 410).

Figure 4B:
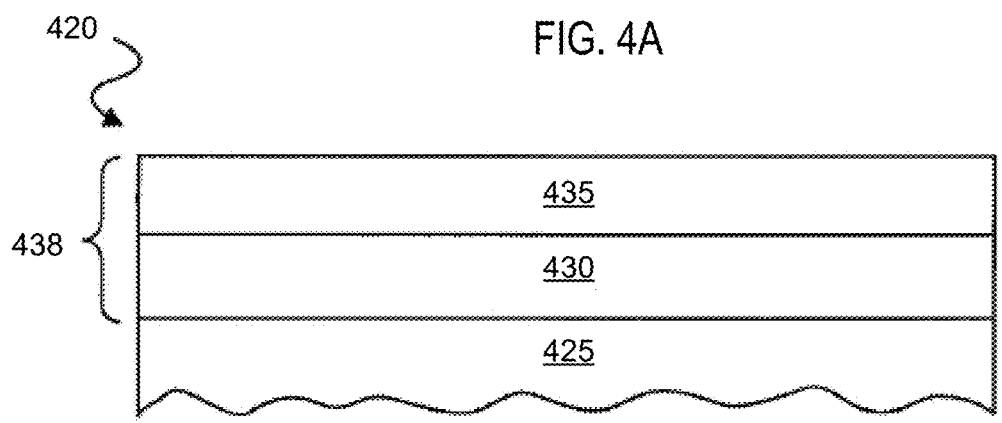

FIG. 4B illustrates a cross sectional side view of one embodiment of an article 420 having a thin film protective layer stack 438 deposited over a body 425 of the article 420. Each thin film protective layer 430, 435 in the thin film protective layer stack 438 may be one of the ceramic materials described above. In one embodiment, the same ceramic material is not used for two adjacent thin film protective layers. However, in another embodiment adjacent layers may be composed of the same ceramic.

Figure 4C:
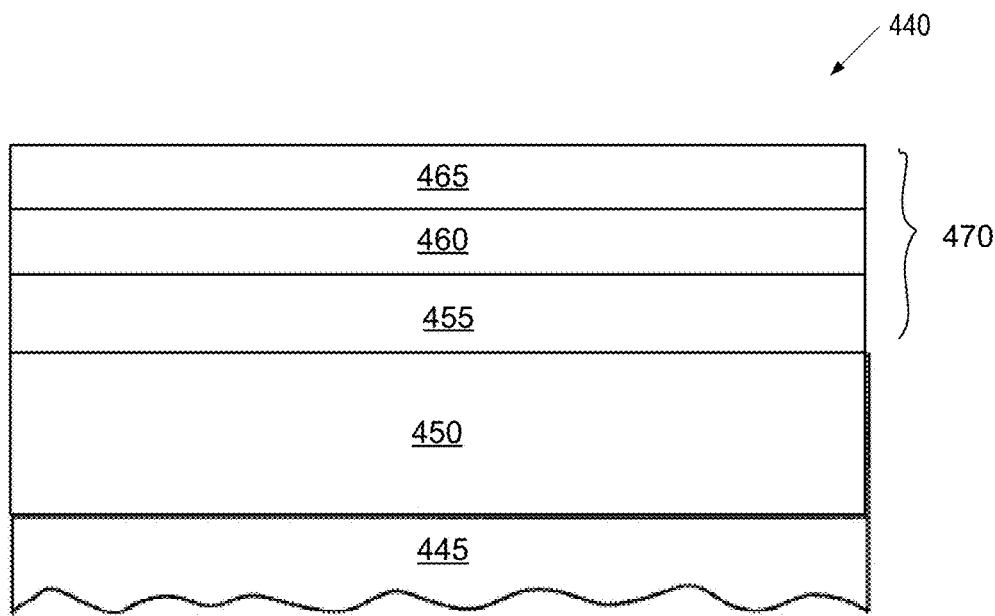

FIG. 4C illustrates a cross sectional side view of another embodiment of an article 440 having a thick protective layer 450 and a thin film protective layer stack 470 deposited over the thick protective layer 450.

The thin film protective layer stacks (such as those illustrated) may have any number of thin film protective layers. The thin film protective layers in a stack may all have the same thickness, or they may have varying thicknesses. Each of the thin film protective layers may have a thickness of less than approximately 20 microns, and less than approximately 10 microns in some embodiments. In one example, a first layer 430 may have a thickness of 4 microns, and a second layer 435 may have a thickness of 1 micron. If the first layer is amorphous and the second layer is crystalline, then such a bi-layer architecture may reduce cracking probability while providing enhanced erosion resistance. In another example, first layer 455 may be a YAG layer having a thickness of 2 microns, second layer 460 may be a compound ceramic layer having a thickness of 1 micron, and third layer 465 may be a YAG layer having a thickness of 1 micron.

The selection of the number of ceramic layers and the composition of the ceramic layers to use may be based on a desired application and/or a type of article being coated. EAG and YAG thin film protective layers formed by IAD and PVD typically have an amorphous structure. In contrast, the IAD and PVD deposited compound ceramic and $Er_2O_3$ layers typically have a crystalline or nano-crystalline structure. Crystalline and nano-crystalline ceramic layers may generally be more erosion resistant than amorphous ceramic layers. However, in some instances thin film ceramic layers having a crystalline structure or nano-crystalline structure may experience occasional vertical cracks (cracks that run approximately in the direction of the film thickness and approximately perpendicular to the coated surface). Such vertical cracks may be caused by lattice mismatch and may be points of attack for plasma chemistries. Each time the article is heated and cooled, the mismatch in coefficients of thermal expansion between the thin film protective layer and the substrate that it coats cause stress on the thin film protective layer. Such stress may be concentrated at the vertical cracks. This may cause the thin film protective layer to eventually peel away from the substrate that it coats. In contrast, if there are not vertical cracks, then the stress is approximately evenly distributed across the thin film. Accordingly, in one embodiment a first layer 430 in the thin film protective layer stack 438 is an amorphous ceramic such as YAG or EAG, and the second layer 435 in the thin film protective layer stack 438 is a crystalline or nano-crystalline ceramic such as the ceramic compound or $Er_2O_3$. In such an embodiment, the second layer 435 may provide greater plasma resistance as compared to the first layer 430. By forming the second layer 435 over the first layer 430 rather than directly over the body 425, the first layer 430 acts as a buffer to minimize lattice mismatch on the subsequent layer. Thus, a lifetime of the second layer 435 may be increased.

In another example, each of the body, $Y_3Al_5O_{12}$ (YAG), $Y_4Al_2O_9$, $Er_2O_3$, $Gd_2O_3$, $Er_3Al_5O_{12}$, $Gd_3Al_5O_{12}$, and the ceramic compound comprising $Y_4Al_2O_9$ and a solid-solution of $Y_2O_3$—$ZrO_2$ may have a different coefficient of thermal expansion. The greater the mismatch in the coefficient of thermal expansion between two adjacent materials, the greater the likelihood that one of those materials will eventually crack, peel away, or otherwise lose its bond to the other material. The protective layer stacks 438, 470 may be formed in such a way to minimize mismatch of the coefficient of thermal expansion between adjacent layers (or between a layer and a body 425, 445). For example, thick protective layer 450 may be alumina, and EAG may have a coefficient of thermal expansion that is closest to that of alumina, followed by the coefficient of thermal expansion for YAG, followed by the coefficient of thermal expansion for the compound ceramic. Accordingly, first layer 455 may be EAG, second layer 460 may be YAG, and third layer 465 may be the compound ceramic in one embodiment.

In another example, the layers in the protective layer stack 470 may be alternating layers of two different ceramics. For example, first layer 455 and third layer 465 may be YAG, and second layer 460 and a fourth layer (not illustrated) may be the compound ceramic. Such alternating layers may provide advantages similar to those set forth above in cases where one material used in the alternating layers is amorphous and the other material used in the alternating layers is crystalline or nano-crystalline.

In some embodiments, one of more of the layers in the thin film protective layer stacks 438, 470 are transition layers formed using a heat treatment. If the body 425, 445 is a ceramic body, then a high temperature heat treatment may be performed to promote interdiffusion between a thin film protective layer and the body. Additionally, the heat treatment may be performed to promote interdiffusion between adjacent thin film protective layers or between a thick protective layer and a thin film protective layer. Notably, the transition layer may be a non-porous layer. The transition layer may act as a diffusion bond between two ceramics, and may provide improved adhesion between the adjacent ceramics. This may help prevent a protective layer from cracking, peeling off, or stripping off during plasma processing.

The thermal treatment may be a heat treatment at up to about 1400-1600 degrees C. for a duration of up to about 24 hours (e.g., 3-6 hours in one embodiment). This may create an inter-diffusion layer between a first thin film protective layer and one or more of an adjacent ceramic body, thick protective layer or second thin film protective layer. If the ceramic body is $Al_2O_3$, and the protective layer is composed of a compound ceramic $Y_4Al_2O_9$ (YAM) and a solid solution $Y_2$-$xZr_xO_3$ ($Y_2O_3$—$ZrO_2$ solid solution), then a $Y_3Al_5O_{12}$ (YAG) interface layer will be formed. Similarly, a heat treatment will cause a transition layer of EAG to form between $Er_2O_3$ and $Al_2O_3$. A heat treatment will also cause a transition layer of YAG to form between $Y_2O_3$ and $Al_2O_3$. A heat treatment may also cause GAG to form between $Gd_2O_3$ and $Al_2O_3$. A heat treatment of yttria stabilized zirconia (YSZ) over $Al_2O_3$ can form a transition layer of the compound ceramic of $Y_4Al_2O_9$ (YAM) and a solid solution $Y_2$-$xZr_xO_3$. Other transition layers may be formed between other adjacent ceramics.

In one embodiment, a coloring agent is added during the deposition of the first protective layer 308, 408. Accordingly, when the second protective layer 310, 410 wears away, an operator may have a visual queue that it is time to refurbish or exchange the lid or nozzle.

Figure 5:
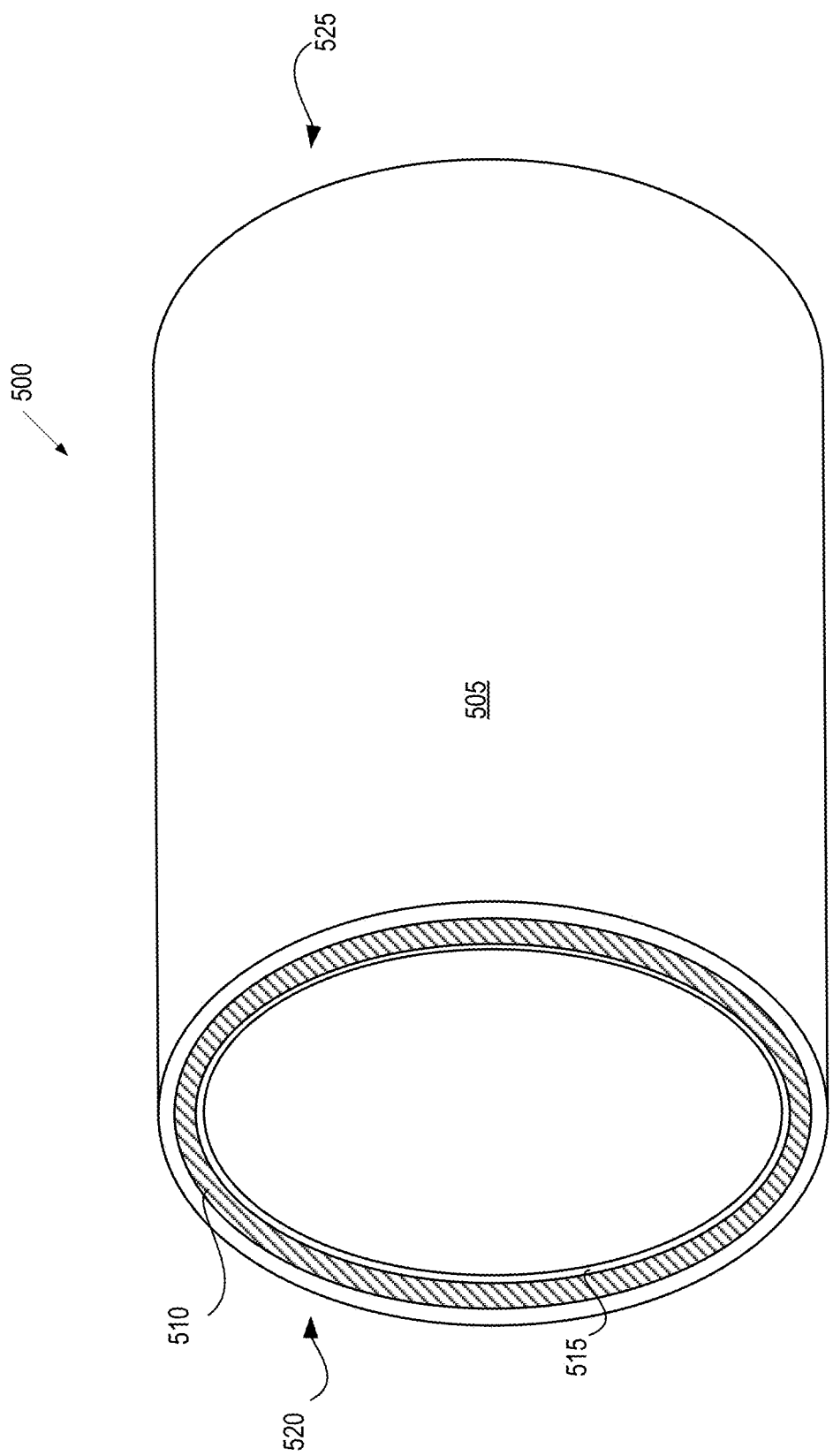
FIG. 5 illustrates a chamber liner having a rare earth oxide plasma resistant layer, in accordance with one embodiment.

FIG. 5 illustrates a chamber liner 500 having a hollow cylindrical body 505. The hollow cylindrical body 505 may be Aluminum or an Aluminum alloy in one embodiment. The hollow cylindrical body 505 has a plasma sprayed Yttrium based plasma resistant layer 510 coating an inner surface of the body 505. The plasma sprayed Yttrium based plasma resistant layer 510 may have numerous cracks and pores. For example, the plasma sprayed Yttrium based plasma resistant layer 510 may have a porosity of approximately 2-4% in one embodiment. The chamber liner 500 further includes a thin film protective layer 515 coating the plasma sprayed Yttrium based plasma resistant layer 510. The thin film protective layer 515 may be composed of a plasma resistant rare earth oxide, such as those discussed herein above. The thin film protective layer 515 may be conformal and dense, with a porosity of less than 1%. In one embodiment, the porosity is effectively 0% (e.g., less than 0.1%). The thin film protective layer 515 may seal the cracks and pores of the plasma sprayed Yttrium based plasma resistant layer 510.

The chamber liner 500 has a first side 520 and a second side 525. The thin film protective layer 515 may be deposited by IAD or PVD in multiple passes. In one embodiment, a target material and electron beam gun are positioned at the first side 520 initially during the deposition process. The chamber liner 500 may be rotated during the process to coat the some or all off the inner surface of the chamber liner 500. Regions of the chamber liner 500 that are closer to the first side 520 may be closer to the target material and gun, and may thus receive a thicker deposited thin film protective layer 515 than regions that are far from the first side. Accordingly, the chamber liner 500 may be repositioned so that the target material and electron beam gun are positioned at the second side 525 of the chamber liner 500 during a second portion of the deposition process. This may ensure that all regions of the chamber liner's inner surface receive a relatively uniform coating.

Some locations of the chamber liner 500 may be more prone to erosion than other areas. In one embodiment, the chamber liner 500 is masked before deposition of the thin film protective layer 515. The mask may cover regions that are less prone to erosion and expose those regions that are more prone to erosion. Accordingly, the deposited thin film protective layer 515 may cover those regions that experience higher erosion rates without covering those regions that experience lower erosion rates.

Figure 6A:
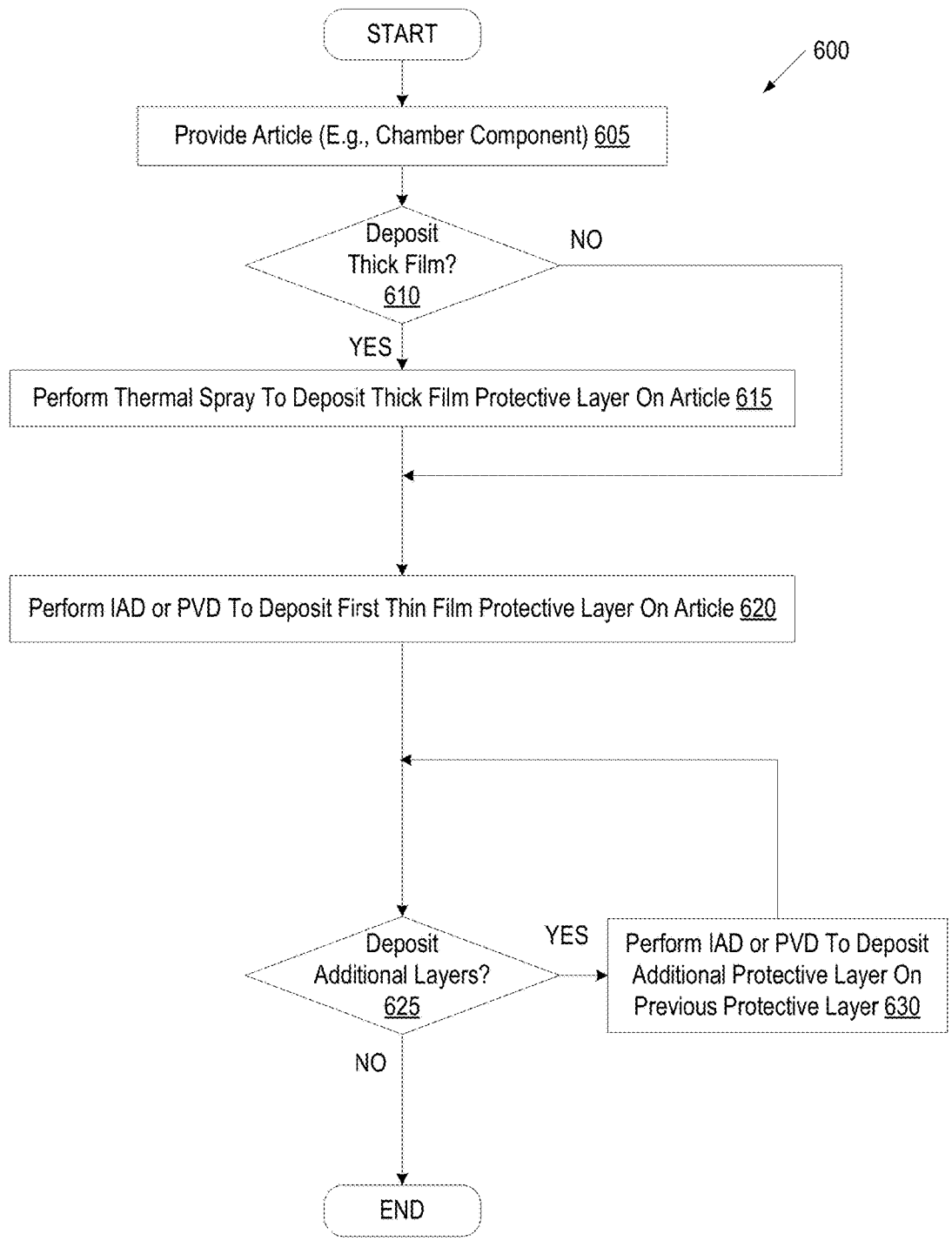
FIG. 6A illustrates one embodiment of a process for forming one or more protective layers over an article.

FIG. 6A illustrates one embodiment of a process 600 for forming a thin film protective layer over a body of an article such as a chamber component. At block 605 of process 600, an article is provided. At block 610, a determination is made of whether or not to deposit a thick film protective layer onto the article. If a thick film protective layer is to be formed, the method proceeds to block 615. Otherwise, the method continues to block 620.

At block 615, a thermal spray process (e.g., a plasma spray process) is performed to deposit a thick film protective layer onto the article. Prior to performing the thermal spray process, the body of the article may be roughened in some embodiments. The thick film protective layer may be any plasma resistant ceramic. Some examples of thick film protective layers include $Y_3Al_6O_{12}$, $Y_4Al_2O_9$, $Y_2O_3$, YSZ, or the ceramic compound comprising $Y_4Al_2O_9$ and a solid-solution of $Y_2O_3$—$ZrO_2$. After the thick film protective layer is formed, for some applications surface features are formed on a surface of the thick film protective layer. For example, if the article is an ESC, then mesas and He holes may be formed. In an alternative embodiment, a plasma resistant ceramic disc or other ceramic structure may be bonded to the body of the article rather than spraying a thick film protective layer.

At block 620, IAD or PVD is performed to deposit a thin film protective layer on the body of the article. If a thick film protective layer was formed at block 615, then the thin film protective layer may be formed over the thick film protective layer as a top coat. In one embodiment, chamber surface preparation is performed prior to performing IAD to deposit the thin film protective layer. For example, ion guns can prepare a surface of the article by using Oxygen and/or Argon ions to burn surface organic contamination and disperse remaining surface particles.

The thin film protective layer may be $Y_3Al_6O_{12}$, $Y_4Al_2O_9$, $Er_2O_3$, $Gd_2O_3$, $Er_3Al_6O_{12}$, $Gd_3Al_6O_{12}$, the ceramic compound of $Y_4Al_2O_9$ and a solid-solution of $Y_2O_3$—$ZrO_2$, or any of the other plasma resistant ceramics described herein. A deposition rate for the thin film protective layer may be about 0.25-10 Angstroms per second (A/s), and may be varied by tuning deposition parameters. In one embodiment, multiple deposition rates are used during deposition of the thin film protective layer. For example, an initial deposition rate of 0.25-1.0 A/s may be used to achieve a conforming and well adhering coating. The deposition rate may then be increased to 2-10 A/s to achieve a thicker coating in a shorter and more cost effective coating run. The thin film protective layers may be very conforming, may be uniform in thickness, and have a good adhesion to the body/substrate that they are deposited on.

In one embodiment, the article is cooled during deposition of the thin film protective layer to maintain a temperature of the article at or below approximately 150° C. In one embodiment, a working distance between a target material and the article is set to less than one meter.

In one embodiment, the article is a chamber liner of an etch reactor, where the chamber liner has a hollow cylindrical shape. Performing the IAD process may include placing the article in a first position such that a target is at a first opening of the article. A first portion of the interior of the article may be coated while the article is in the first position. The article may then be placed in a second position such that the target is at a second opening of the article. A second portion of the interior of the article may be coating while the article is in the second position.

In one embodiment, one or more regions of the article that will exhibit a high erosion rate relative to other regions of the article are identified. The article is then masked with a mask that exposed the identified one or more regions. The IAD deposition is then performed to form the thin film protective layer at the identified one or more regions.

At block 625, a determination is made regarding whether to deposit any additional thin film protective layers. If an additional thin film protective layer is to be deposited, the process continues to block 630. At block 630, another thin film protective layer is formed over the first thin film protective layer. The other thin film protective layer may be composed of a ceramic that is different than a ceramic of the first thin film protective layer. In one embodiment, the other thin film protective layer is one of $Y_3Al_6O_{12}$, $Y_4Al_2O_9$, $Er_2O_3$, $Gd_2O_3$, $Er_3Al_6O_{12}$, $Gd_3Al_6O_{12}$, the ceramic compound of $Y_4Al_2O_9$ and a solid-solution of $Y_2O_3$—$ZrO_2$, or any of the other ceramic materials described herein. The method then returns to block 625. If at block 625 no additional thin film protective layers are to be applied, the process ends. After any of the thin film protective layers is deposited, surface features may be formed in that thin film protective layer.

Figure 6B:
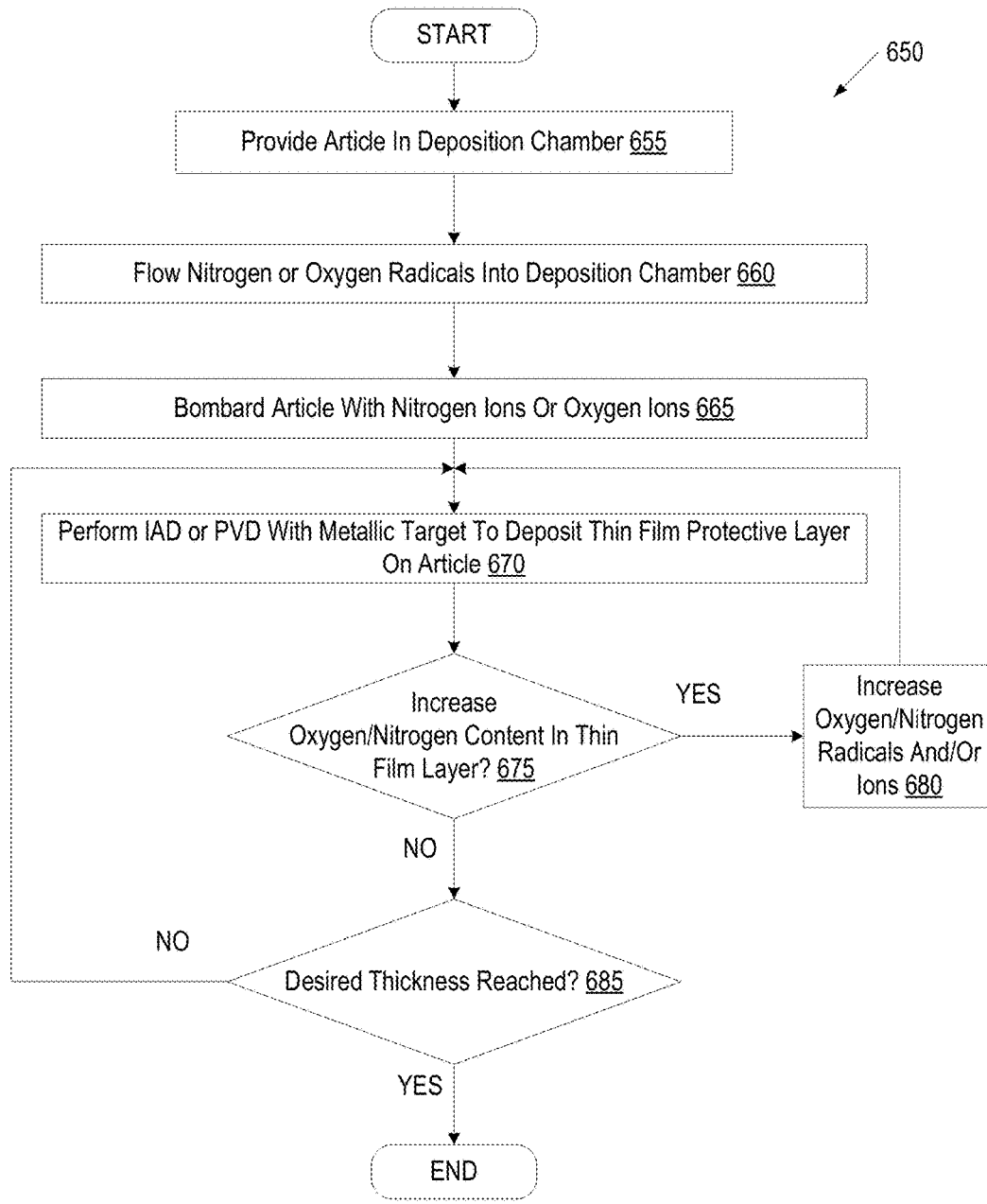
FIG. 6B illustrates one embodiment of a process for forming a thin film protective layer over a body of an article using an IAD or PVD with a metallic target.

FIG. 6B illustrates one embodiment of a process 650 for forming a thin film protective layer over a body of an article using IAD or PVD with a metallic target. At block 655 of process 600, an article is provided in a deposition chamber. At block 660, Nitrogen or Oxygen radicals are flowed into the deposition chamber at a flow rate. At block 665, Nitrogen or Oxygen ions are used to bombard the article. At block 670, IAD or PVD is performed with a metallic target to deposit a thin film protective layer on the article. An electron beam vaporizes or sputters the metallic target, which reacts with the Nitrogen or Oxygen radicals and/or ions to form a ceramic in situ. If nitrogen radicals and/or ions are used, then the ceramic will be a nitride. If Oxygen radicals and/or ions are used, then the ceramic will be an oxide.

At block 675, a determination is made of whether to increase the Oxygen or Nitrogen content in the thin film protective layer. If the Oxygen or Nitrogen content is to be increased, the process continues to block 680. At block 680, the flow of Oxygen radicals or Nitrogen radicals may be increased. Alternatively or additionally, the bombardment by Oxygen ions or Nitrogen ions may be increased. The process then returns to block 670. If at block 675 a determination is made not to increase the Oxygen or Nitrogen content in the thin film protective layer, the process proceeds to block 685.

At block 685, a determination is made of whether the thin film protective layer has reached a desired thickness. If a desired thickness has been reached, the process terminates. If a desired thickness has not been reached, the process returns to block 670.

With IAD processes, the energetic particles may be controlled by the energetic ion (or other particle) source independently of other deposition parameters. According to the energy (e.g., velocity), density and incident angle of the energetic ion flux, composition, structure, crystalline orientation and grain size of the thin film protective layer may be manipulated. Additional parameters that may be adjusted are a temperature of the article during deposition as well as the duration of the deposition. The ion energy may be roughly categorized into low energy ion assist and high energy ion assist. Low energy ion assist may include a voltage of about 230V and a current of about 5 A. High energy ion assist may include a voltage of about 270V and a current of about 7 A. The low and high energy for the ion assist is not limited to the values mentioned herein. The high and low level designation may additionally depend on the type of the ions used and/or the geometry of the chamber used to perform the IAD process. The ions are projected with a higher velocity with high energy ion assist than with low energy ion assist. Substrate (article) temperature during deposition may be roughly divided into low temperature (around 120-150° C. in one embodiment which is typical room temperature) and high temperature (around 270° C. in one embodiment). For high temperature IAD deposition processes, the article may be heated prior to and during deposition.

TABLE 2A

Example Thin Film Protective Layers Formed Using IAD

| Material | Thk. (μm) | Dep. Rate (A/s) | Ion Assist | Temp. (° C.) | XRD | Vacuum (cm³/s) | Hardness (GPa) |
|---|---|---|---|---|---|---|---|
| 1st Compound Ceramic (sintered plug) | 5 | 2 | 230 V, 5 A | 270 | C | N/A | 4.11 |
| 2nd Compound Ceramic (sintered plug) | 6 | 1 for 2 μm 2 for 4 μm | 230 V, 5 A | 270 | C + A | 5.0E−6 | |

TABLE 2A-continued

Example Thin Film Protective Layers Formed Using IAD

| Material | Thk. (μm) | Dep. Rate (A/s) | Ion Assist | Temp. (° C.) | XRD | Vacuum (cm³/s) | Hardness (GPa) |
|---|---|---|---|---|---|---|---|
| 3rd Compound Ceramic (sintered plug) | 5 | 1 | 230 V, 5 A | 270 | C + A | 6.3E−6 | |
| 4th Compound Ceramic (sintered plug) | 5 | 1 for 1 μm 2 for 4 μm | 270 V, 7 A | 270 | A | 1.2E−9 | 7.825 |
| 5th Compound Ceramic (calcined powder) | 5 | 1 for 1 μm 2 for 4 μm | 270 V, 7 A | 120-150 | A | 1.2E−9 | |
| 6th Compound Ceramic (calcined powder) | 5 | 1 for 1 μm 4 for 4 μm | 270 V, 7 A | 120-150 | A | 1.2E−9 | 7.812 |
| 1st YAG (fused lump) | 5 | 2.5 | 230 V, 5 A | 270 | A | 3.7E−7 | 5.7 |
| 2nd YAG (fused lump) | 5 | 1 for 1 μm 2 for 4 μm | 270 V, 7 A | 270 | A | 4.4E−10 | 8.5 |
| Compound Ceramic/YAG | 5 | 2 | 230 V, 5 A | 270 | C + A | 3.7E−7 | |
| 1st Er₂O₃ (sintered lump) | 5 | 2 | 230 V, 5 A | 270 | C | 3E−6 | |
| 2nd Er₂O₃ (sintered lump) | 5 | 1 for 1 μm 2 for 4 μm | 270 V, 7 A | 270 | C | 5.5E−9 | 5.009 |

TABLE 2B

Example Thin Film Protective Layers Formed Using IAD

| Material | Thk. (μm) | Dep. Rate (A/s) | Ion Assist | Temp. (° C.) | XRD | Vacuum (cm³/s) | Hardness (GPa) |
|---|---|---|---|---|---|---|---|
| 1st EAG (calcined powder) | 7.5 | 1 for 1 μm 2 for next | 270 V, 7 A | 270 | A | 9.5E−10 | 8.485 |
| 2nd EAG (calcined power) | 7.5 | 1 for 1 μm 2 for next | 270 V, 7 A | 120-150 | A | 2.5E−9 | 9.057 |
| 3rd EAG (calcined powder) | 5 | 1 for 1 μm 2 for 4 μm | 270 V, 7 A | | A | | |
| Y₂O₃ (fused lump) | 5 | 1 for 1 μm 2 for 4 μm | 270 V, 7 A | 270 | C | | |
| YZ20 (Powder) | 5 | 1 for 1 μm 2 for 4 μm | 270 V, 7 A | 120-150 | C | 1.6E−7 | 5.98 |

Tables 2A-2B show multiple example thin film protective layers formed using IAD with various deposition parameters. The experimental results identify an optimized coating process based on a multi-factorial design of experiments (DOE) that varies ion assisted energy, deposition rate and temperature to obtain a conforming, dense microstructure. The coatings are characterized in terms of material properties (microstructure and/or crystal phase) and mechanical properties (hardness and adhesion), as well as crack density and vacuum sealing capability. IAD coating process optimization can produce IAD coatings with high density thin-films with low residual stress. The optimized parameters can be used for most rare earth oxide based coating materials.

Six different examples are shown for thin film protective layers formed from the ceramic compound of $Y_4Al_2O_9$ and a solid-solution of $Y_2O_3$—$ZrO_2$. A first example compound ceramic thin film protective layer has a thickness of 5 microns, and was formed using IAD with a low energy ion assist and a sintered plug target, a deposition temperature of 270° C., and a deposition rate of 2 angstroms per seconds (A/s). X-ray diffraction showed that the first example compound ceramic thin film protective layer had a crystalline structure. The first example compound ceramic thin film protective layer also had a hardness of 4.11 GPa and visual inspection showed good conformance to the underlying substrate as well as some vertical cracks and some spikes.

A second example compound ceramic thin film protective layer has a thickness of 6 microns, and was formed using IAD with a low energy ion assist and a sintered plug target, a deposition temperature of 270° C., and a deposition rate of 1 A/s for the first 2 microns and a deposition rate of 2 A/s for the subsequent 4 microns. X-ray diffraction showed that the second example compound ceramic thin film protective layer had a nano-crystalline structure (in which portions are crystalline and portions are amorphous). When used as a seal, the second example compound ceramic thin film protective layer was able to maintain a vacuum down to 5E-6 cubic centimeters per second (cm³/s). Visual inspection of the second example compound ceramic thin film protective layer showed good conformance and fewer vertical cracks than the first example compound ceramic thin film protective layer.

A third example compound ceramic thin film protective layer has a thickness of 5 microns, and was formed using IAD with a low energy ion assist and a sintered plug target, a deposition temperature of 270° C., and a deposition rate of 1 A/s. X-ray diffraction showed that the third example compound ceramic thin film protective layer had a nano-crystalline structure. When used as a seal, the third example compound ceramic thin film protective layer was able to maintain a vacuum down to 6.3E-6 cm³/s. Visual inspection of the third example compound ceramic thin film protective layer showed good conformance and fewer vertical cracks than the first example compound ceramic thin film protective layer.

A fourth example compound ceramic thin film protective layer has a thickness of 5 microns, and was formed using IAD with a high energy ion assist and a sintered plug target, a deposition temperature of 270° C., and a deposition rate of 1 A/s for the first micron and 2 A/s for the subsequent 4 microns. X-ray diffraction showed that the third example compound ceramic thin film protective layer had an approximately amorphous structure. When used as a seal, the third example compound ceramic thin film protective layer was able to maintain a vacuum down to 1.2E-9 cm$^3$/s. Visual inspection of the fourth example compound ceramic thin film protective layer showed good conformance, a smooth surface and very few vertical cracks. Additionally, the fourth example compound ceramic thin film protective layer has a hardness of 7.825 GPa.

A fifth example compound thin film protective layer was formed using the same parameters as the fourth example compound thin film protective layer, but with a deposition temperature at room temperature (around 120-150° C.) and with a calcined powder target. The fifth example compound thin film protective layer showed similar properties to those of the fourth example compound thin film protective layer.

A sixth example compound ceramic thin film protective layer has a thickness of 5 microns, and was formed using IAD with a high energy ion assist and a calcined powder target, a deposition temperature of 270° C., and a deposition rate of 1 A/s for the first micron and 4 A/s for the subsequent 4 microns. X-ray diffraction showed that the third example compound ceramic thin film protective layer had an approximately amorphous structure. When used as a seal, the third example compound ceramic thin film protective layer was able to maintain a vacuum down to 1.2E-9 cm$^3$/s. The fourth example compound ceramic thin film protective layer has a hardness of 7.812 GPa.

A first example YAG thin film protective layer has a thickness of 5 microns, and was formed using IAD with a low energy ion assist and a fused lump target, a deposition temperature of 270° C., and a deposition rate of 2.5 A/s. X-ray diffraction showed that the first YAG ceramic thin film protective layer had an amorphous structure. The first YAG thin film protective layer also had a hardness of 5.7 GPa and visual inspection showed good conformance, minimal cracking and a smooth surface.

A second example YAG thin film protective layer has a thickness of 5 microns, and was formed using IAD with a high energy ion assist and a fused lump target, a deposition temperature of 270° C., and a deposition rate of 1 A/s for a first micron and 2 A/s for the subsequent 4 microns. X-ray diffraction showed that the second YAG thin film protective layer had an amorphous structure. The second YAG thin film protective layer also had a hardness of 8.5 GPa and visual inspection showed good conformance, reduced cracking compared to the first YAG thin film and a smooth surface.

An example thin film protective layer stack with alternating compound ceramic and YAG layers has a thickness of 5 microns, and was formed using IAD with a low energy ion assist, a deposition temperature of 270° C., and a deposition rate of 2 A/s. X-ray diffraction showed that the alternating layers were amorphous (for the YAG layers) and crystalline or nano-crystalline (for the compound ceramic layers). Visual inspection showed reduced vertical cracks for the compound ceramic layers.

A first example Er$_2$O$_3$ thin film protective layer has a thickness of 5 microns, and was formed using IAD with a low energy ion assist and a sintered lump target, a deposition temperature of 270° C., and a deposition rate of 2 A/s. X-ray diffraction showed that the first Er$_2$O$_3$ ceramic thin film protective layer had a crystalline structure. Visual inspection showed good conformance and a vertical cracking.

A second example Er$_2$O$_3$ thin film protective layer has a thickness of 5 microns, and was formed using IAD with a high energy ion assist and a sintered lump target, a deposition temperature of 270° C., and a deposition rate of 1 A/s for the first micron and a deposition rate of 2 A/s for the subsequent 4 microns. X-ray diffraction showed that the second Er$_2$O$_3$ ceramic thin film protective layer had a crystalline structure. Visual inspection showed good conformance and a less vertical cracking compared to the first Er$_2$O$_3$ ceramic thin film protective layer.

A first example EAG thin film protective layer has a thickness of 7.5 microns, and was formed using IAD with a high energy ion assist and a calcined powder target, a deposition temperature of 270° C., and a deposition rate of 1 A/s for the first micron and a deposition rate of 2 A/s for the subsequent microns. X-ray diffraction showed that the first EAG ceramic thin film protective layer had an amorphous structure, and the layer had a hardness of 8.485 GPa. Visual inspection showed good conformance and minimal cracking.

A second example EAG thin film protective layer has a thickness of 7.5 microns, and was formed using IAD with a high energy ion assist and a calcined powder target, a deposition temperature of 120-150° C., and a deposition rate of 1 A/s for the first micron and a deposition rate of 2 A/s for the subsequent microns. X-ray diffraction showed that the second EAG ceramic thin film protective layer had an amorphous structure, and the layer had a hardness of 9.057 GPa. Visual inspection showed good conformance and a less cracking compared to the first EAG ceramic thin film protective layer.

A third example EAG thin film protective layer has a thickness of 5 microns, and was formed using IAD with a high energy ion assist and a calcined powder target, and a deposition rate of 1 A/s for the first micron and a deposition rate of 2 A/s for the subsequent microns. X-ray diffraction showed that the third EAG ceramic thin film protective layer had an amorphous structure.

An example Y$_2$O$_3$ thin film protective layer has a thickness of 5 microns, and was formed using IAD with a high energy ion assist and a fused lump target, a temperature of 270° C., and a deposition rate of 1 A/s for the first micron and a deposition rate of 2 A/s for the subsequent microns. X-ray diffraction showed that the third EAG ceramic thin film protective layer had a crystalline structure.

An example YZ20 thin film protective layer has a thickness of 5 microns, and was formed using IAD with a high energy ion assist and a powder target, a temperature of 120-150° C., and a deposition rate of 1 A/s for the first micron and a deposition rate of 2 A/s for the subsequent microns. X-ray diffraction showed that the YZ20 ceramic thin film protective layer had a crystalline structure. When used as a seal, the YZ20 ceramic thin film protective layer was able to maintain a vacuum down to 1.6E-7 cm$^3$/s. The YZ20 ceramic thin film protective layer had a hardness of 5.98 GPa.

FIGS. 7A-7E illustrate scanning electron microscope (SEM) images of articles having a thin film protective layer formed from the ceramic compound of Y$_4$Al$_2$O$_9$ and a solid-solution of Y$_2$O$_3$—ZrO$_2$ deposited over a plasma sprayed protective layer also formed from the ceramic compound of Y$_4$Al$_2$O$_9$ and a solid-solution of Y$_2$O$_3$—ZrO$_2$. FIG. 7A shows a top down SEM image of a flat region of an article that has been coated with the plasma sprayed layer. The SEM image of FIG. 7A has a magnification of approximately 10,000 and a view field of approximately 22 µm. The plasma sprayed layer includes multiple cracks, such as crack 710. FIG. 7B shows a top down SEM image of a flat region of the article after the thin film protective layer has been deposited over the plasma sprayed layer. The SEM image of FIG. 7B has a magnification of approximately 10,000 and a view field of approximately 23 µm. The thin film protective layer has sealed the cracks in the plasma sprayed layer. A sealed crack 715 is shown.

FIG. 7C shows a cross sectional side view SEM image of a flat region of an article with a thin film protective layer 725 coating a plasma sprayed protective layer 720. The SEM image of FIG. 7C has a magnification of approximately 10,000 and a view field of approximately 23 µm. FIG. 7D shows a cross sectional side view SEM image of a horizontal grating region of an article with a thin film protective layer 735 coating a plasma sprayed protective layer 730. The SEM image of FIG. 7D has a magnification of approximately 10,000 and a view field of approximately 23 µm. FIG. 7E shows a cross sectional side view SEM image of a vertical grating region of an article with a thin film protective layer 745 coating a plasma sprayed protective layer 740. The SEM image of FIG. 7E has a magnification of approximately 4,000 and a view field of approximately 56 µm.

As shown in the SEM images of FIGS. 7A-7E, the thin film protective layer conforms to the surface of the plasma sprayed protective layer. Additionally, the thin film protective layer seals cracks and pores in the plasma sprayed protective layer in flat regions, horizontal grating regions and vertical grating regions.

Sample erosion rates of various materials exposed to dielectric etch $CF_4$ chemistry, including erosion rates of multiple different IAD coatings generated in accordance with embodiments, are now described. An erosion rate of 92% alumina is around 1.38 microns per radiofrequency hour (µm/Rfhr). An erosion rate of 99.8% alumina is around 1.21 µm/Rfhr. An erosion rate of IAD deposited YAG is around 0.28 µm/Rfhr. An erosion rate of IAD deposited EAG is about 0.24 µm/Rfhr. An erosion rate of IAD deposited $Y_2O_3$ is about 0.18 µm/Rfhr. An erosion rate of IAD deposited Er2O3 is about 0.18 µm/Rfhr. An erosion rate of the IAD deposited compound ceramic is about 0.18 µm/Rfhr. A radiofrequency hour is an hour of processing.

Figure 8:
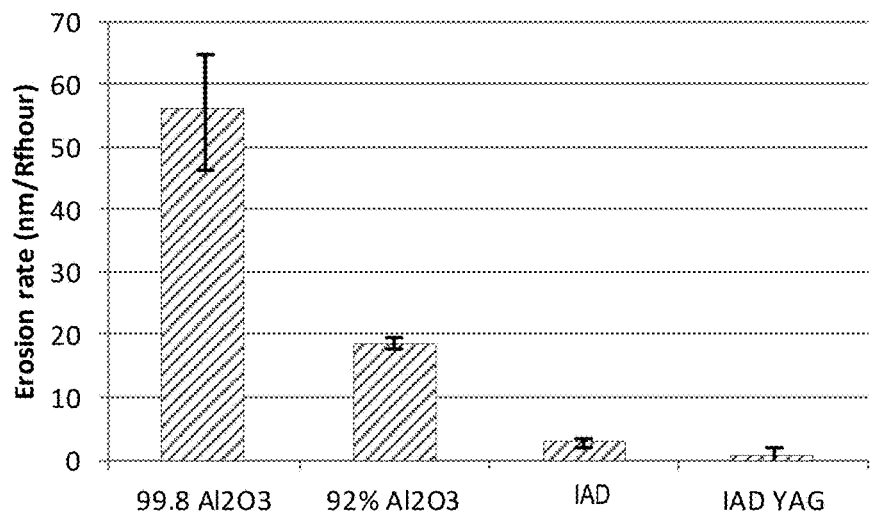
FIGS. 8 and 9 illustrate erosion rates under $CH_4$—$Cl_2$ and $CHF_3$—$NF_3$—$Cl_2$ chemistries respectively for thin film protective layers formed in accordance with embodiments of the present invention.
Figure 9:
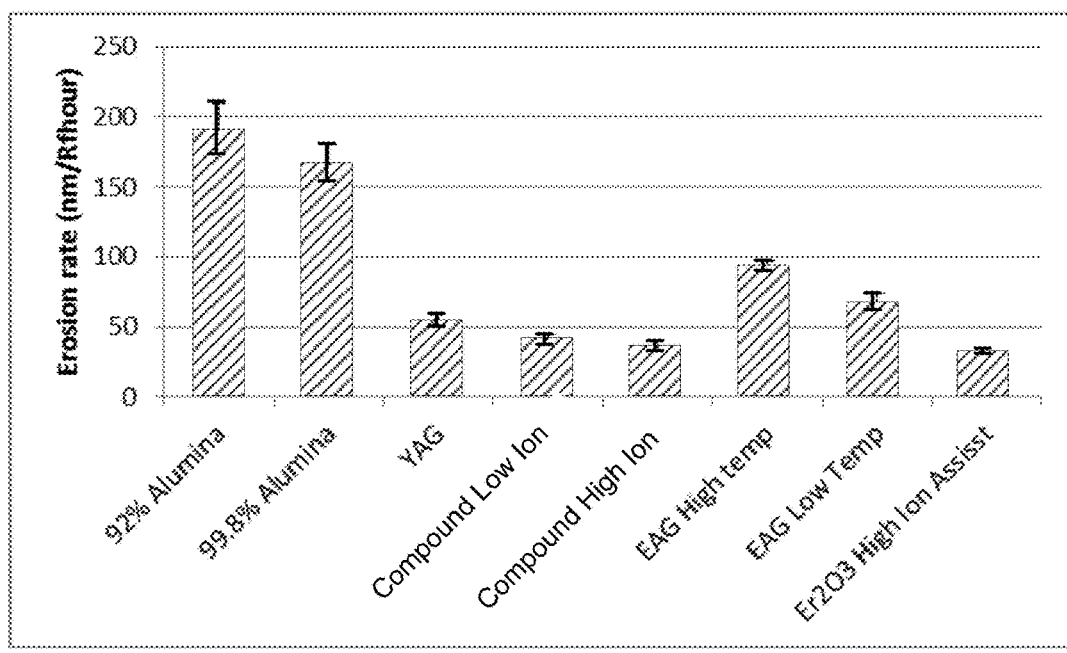

FIGS. 8-9 illustrate erosion rates for thin film protective layers formed in accordance with embodiments of the present invention. FIG. 8 shows erosion rates of thin film protective layers when exposed to a $CH_4/Cl_2$ plasma chemistry. As shown, the IAD deposited thin film protective layers show a much improved erosion resistance as compared to $Al_2O_3$. For example, alumina with a 92% purity showed an erosion rate of around 18 nanometers pre radiofrequency hour (nm/RFHr) and alumina with a 99.8% purity showed an erosion rate of about 56 nm/RFHr. In contrast an IAD deposited compound ceramic thin film protective layer showed an erosion rate of about 3 nm/RFHr and an IAD deposited YAG thin film protective layer showed an erosion rate of about 1 nm/RFHr.

FIG. 9 shows erosion rates of thin film protective layers when exposed to a $H_2/NF_3$ plasma chemistry. As shown, the IAD deposited thin film protective layers show a much improved erosion resistance as compared to $Al_2O_3$. For example, alumina with a 92% purity showed an erosion rate of around 190 nm/RFHr and alumina with a 99.8% purity showed an erosion rate of about 165 nm/RFHr. In contrast an IAD deposited YAG thin film protective layer showed an erosion rate of about 52 nm/RFHr. Similarly, a compound ceramic thin film protective layer deposited using IAD with low energy ions showed an erosion rate of about 45 nm/RFHr and a compound ceramic thin film protective layer deposited using IAD with high energy ions showed an erosion rate of about 35 nm/RFHr. An EAG thin film protective layer deposited using IAD with high deposition temperature (e.g., around 270° C.) showed an erosion rate of about 95 nm/RFHr and an EAG thin film protective layer deposited using IAD with low deposition temperature (e.g., around 120-150° C.) showed an erosion rate of about 70 nm/RFHr. An $Er_2O_3$ thin film protective layer deposited using IAD with high energy ions showed an erosion rate of about 35 nm/RFHr.

Figure 10:
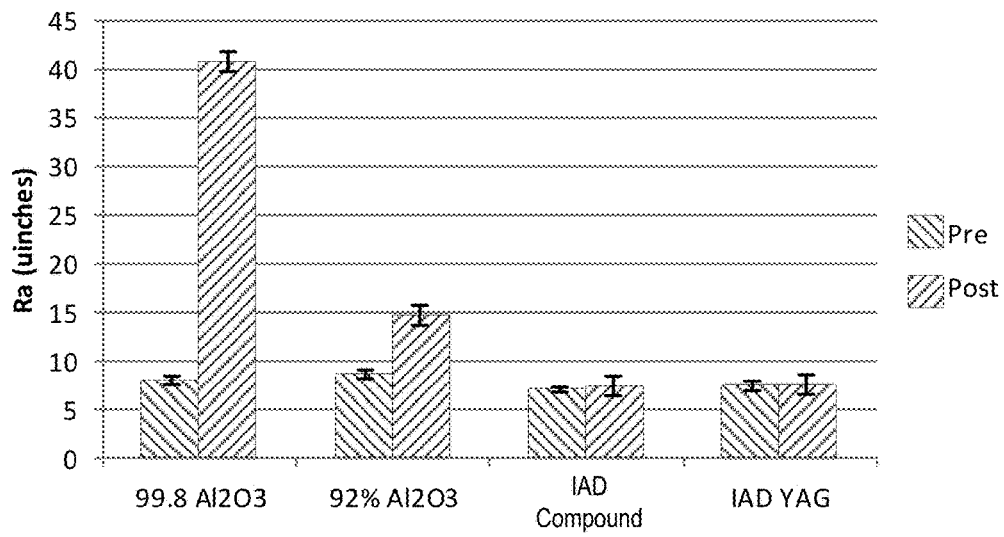
FIGS. 10-11 illustrate roughness profiles under $CH_4$—$Cl_2$ and $CHF_3$—$NF_3$—$Cl_2$ chemistries respectively for thin film protective layers formed in accordance with embodiments of the present invention.
Figure 11:
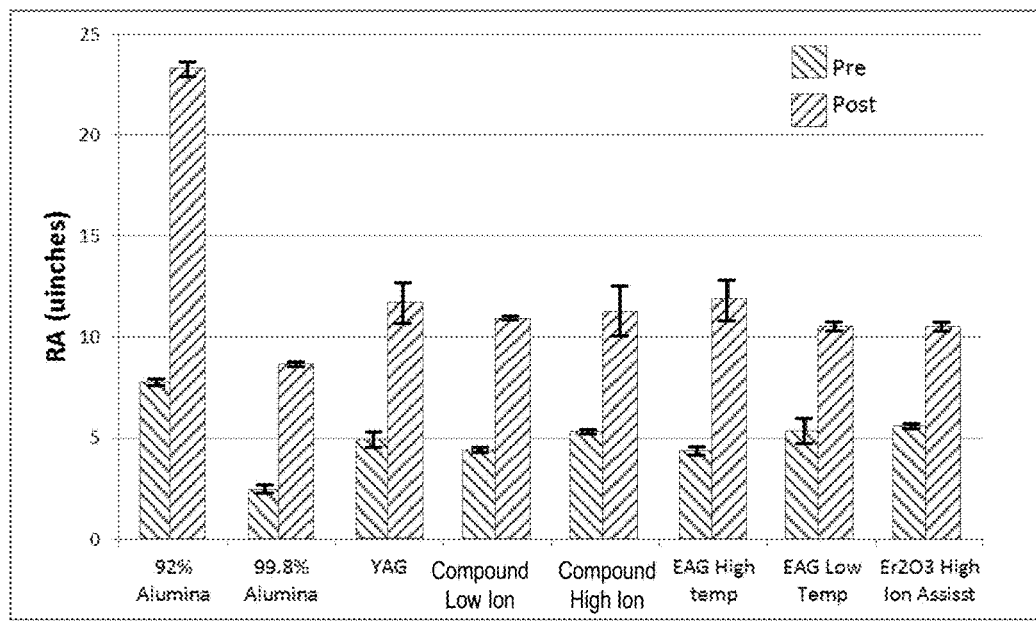

FIGS. 10-11 illustrate roughness profiles for thin film protective layers formed in accordance with embodiments of the present invention. FIG. 10 shows surface roughness profiles of thin film protective layers of FIG. 8 before and after exposure to a $CH_4/Cl_2$ plasma chemistry for 100 RFHrs. As shown, the IAD deposited thin film protective layers show a minimum change in surface roughness after exposure to a $CH_4/Cl_2$ plasma chemistry for 100 RFHrs.

FIG. 11 shows surface roughness profiles of thin film protective layers of FIG. 9 before and after exposure to an $H_2/NF_3$ plasma chemistry for 35 RFHrs. As shown, the IAD deposited thin film protective layers show a minimum change in surface roughness after exposure to an $H_2/NF_3$ plasma chemistry for 35 RFHrs.

Erosion rates of various materials exposed to a $CF_4$—$CHF_3$ trench chemistry at low bias are now briefly discussed. An erosion rate of 92% Alumina is around 0.26 microns per radiofrequency hour (µm/Rfhr), an erosion rate of IAD deposited EAG is around 0.18 µm/Rfhr, an erosion rate of IAD deposited YAG is about 0.15 µm/Rfhr, an erosion rate of the plasma spray deposited compound ceramic is about 0.09 µm/Rfhr, an erosion rate of IAD deposited $Y_2O_3$ is about 0.08 µm/Rfhr, an erosion rate of IAD deposited ceramic compound is about 0.07 µm/Rfhr, an erosion rate of bulk $Y_2O_3$ is about 0.07 µm/Rfhr, an erosion rate of a bulk ceramic compound is about 0.065 µm/Rfhr, and an erosion rate of IAD deposited $Er_2O_3$ is about 0.05 µm/Rfhr. Similar etch results occur when these materials are etched using a $CF_4$—$CHF_3$ trench chemistry at a high bias. For example, at a high bias an etch rate of 92% Alumina is around 1.38 µm/Rfhr, an erosion rate of IAD deposited EAG is around 0.27 µm/Rfhr, an erosion rate of IAD deposited YAG is about 0.27 µm/Rfhr, an erosion rate of the plasma spray deposited compound ceramic is about 0.35 µm/Rfhr, an erosion rate of IAD deposited $Y_2O_3$ is about 0.18 µm/Rfhr, an erosion rate of IAD deposited ceramic compound is about 0.19 µm/Rfhr, an erosion rate of bulk $Y_2O_3$ is about 0.4 µm/Rfhr, an erosion rate of a bulk ceramic compound is about 0.4 µm/Rfhr, and an erosion rate of IAD deposited $Er_2O_3$ is about 0.18 µm/Rfhr.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±30%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:

performing physical vapor deposition (PVD) with a metallic target consisting of an Erbium Aluminum Alloy to deposit a first protective layer consisting of a plasma resistant ceramic on at least one surface of an article, the article comprising a chamber component of a processing chamber, wherein the plasma resistant ceramic consists of $Er_3Al_5O_{12}$ and has an amorphous structure;

performing at least one of flowing Oxygen radicals from a first source into a deposition chamber containing the article at a flow rate or bombarding the article with Oxygen ions from a second source while performing the PVD, wherein the first source is a plasma source, and wherein the metallic target is evaporated or sputtered to react with at least one of the Oxygen radicals from the first source or the Oxygen ions from the second source and form the first protective layer consisting of the plasma resistant ceramic in situ as a result of the PVD; and depositing a second protective layer over the first protective layer, the second protective layer comprising $Er_2O_3$, wherein the second protective layer has a crystalline or nano-crystalline structure.

2. The method of claim 1, further comprising:

gradually increasing the flow rate of the Oxygen radicals while performing the PVD, wherein the deposited first protective layer comprises a first Oxygen content at a bottom of the first protective layer and a higher second Oxygen content at a top of the first protective layer.

3. The method of claim 1, wherein the article comprises a third protective layer that has been deposited by a plasma spray process, the third protective layer having a thickness of greater than approximately 50 microns that comprises a plurality of cracks and pores that are sealed by the first protective layer.

4. The method of claim 1, wherein depositing the second protective layer comprises performing PVD with a metallic Er target.

5. The method of claim 1, further comprising:

concurrent to performing PVD with the metallic target, performing PVD with a second metallic target that has a same composition as the metallic target to deposit the first protective layer on the at least one surface of the article, wherein co-deposition using the metallic target and the second metallic target results in an increased deposition rate.

* * * * *